United States Patent
Yamazaki et al.

(10) Patent No.: US 7,341,954 B2
(45) Date of Patent: Mar. 11, 2008

(54) METHOD AND APPARATUS FOR DETERMINING AN OPERATION STATUS OF A PLASMA PROCESSING APPARATUS, PROGRAM AND STORAGE MEDIUM STORING SAME

(75) Inventors: Yoshihiro Yamazaki, Nirasaki (JP); Hideki Tanaka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/476,104

(22) Filed: Jun. 28, 2006

(65) Prior Publication Data

US 2007/0050076 A1  Mar. 1, 2007

Related U.S. Application Data

(60) Provisional application No. 60/718,303, filed on Sep. 20, 2005.

(30) Foreign Application Priority Data

Aug. 24, 2005 (JP) ............................... 2005-242486

(51) Int. Cl.
   *H01L 21/302* (2006.01)
(52) U.S. Cl. ....................... 438/706; 438/714; 156/345; 216/58
(58) Field of Classification Search ................. 438/706, 438/710, 712, 714, 715, 716; 156/345; 216/58, 216/59, 60, 67
   See application file for complete search history.

(56) References Cited

U.S. PATENT DOCUMENTS

| | | | |
|---|---|---|---|
| 6,618,638 B1* | 9/2003 | Vahedi et al. | 700/108 |
| 2002/0026251 A1* | 2/2002 | Johnson et al. | 700/67 |
| 2004/0067645 A1* | 4/2004 | Chen et al. | 438/689 |
| 2004/0168770 A1* | 9/2004 | Mitrovic et al. | 156/345.43 |
| 2005/0004683 A1* | 1/2005 | Yamazaki | 700/30 |
| 2005/0125090 A1* | 6/2005 | Sakano et al. | 700/108 |
| 2005/0143952 A1* | 6/2005 | Tomoyasu et al. | 702/181 |
| 2005/0146709 A1* | 7/2005 | Oh et al. | 356/72 |

* cited by examiner

*Primary Examiner*—Kin-Chan Chen
(74) *Attorney, Agent, or Firm*—Oblon, Spivak, McClelland, Maier & Neustadt, P.C.

(57) ABSTRACT

In an operation status determination method for a plasma processing apparatus, a principal component analysis is carried out by using operation status data groups. Processing parameter values in the respective operation status data groups are converted into principal component scores which are plotted in a two-dimensional coordinate system with axes of the selected principal components. A movement vector P from a first recipe operation status data group for reference apparatus to a first recipe operation status data group for target apparatus is calculated. An actually measured normal area A2 is set, and a predicted normal area B2 is set by moving the area A2 along the movement vector P. Then, it is determined whether or not the principal component scores corresponding to the respective processing parameter values when the second recipe is applied to the target apparatus are included in the predicted normal area B2.

10 Claims, 12 Drawing Sheet p;bals

METHOD AND APPARATUS FOR DETERMINING AN OPERATION STATUS OF A PLASMA PROCESSING APPARATUS, PROGRAM AND STORAGE MEDIUM STORING SAME

FIELD OF THE INVENTION

The present invention relates to a method and an apparatus for determining an operation status of a plasma processing apparatus, a program and a storage medium storing the program; and, more particularly, to an operation status determination method in a case where a plasma processing apparatus is operated under a plasma process condition applied to another plasma processing apparatus.

BACKGROUND OF THE INVENTION

A plasma processing apparatus, for performing a plasma process on a semiconductor wafer (hereinafter, referred to simply as "wafer") as a substrate, includes a chamber accommodating therein a wafer, an electrode disposed in the chamber and a shower head for supplying a processing gas into the chamber and the like. The plasma processing apparatus further includes various sensors for measuring output values of the components as processing parameters, respectively. The plasma processing apparatus controls the components based on a processing condition (recipe) applied thereto to perform various plasma processes on the wafer. At that time, in the plasma processing apparatus, the output values of the controlled components are measured by the sensors as the processing parameters, which are recorded as log data.

Typically, in case a plasma processing apparatus (hereinafter, referred to as "target apparatus") performs a specific plasma process that has not been executed by the target apparatus, the target apparatus may be operated under a processing condition (hereinafter, referred to as "applied processing condition") applied in another plasma processing apparatus (hereinafter, referred to as "reference apparatus") which executed the specific plasma process. However, since the plasma process is a delicate process, even though the target apparatus performs the plasma process on the wafer under the applied processing condition, the plasma process may not be normally performed on the wafer due to a difference between the reference apparatus and the target apparatus. Accordingly, it is required to determine whether or not the target apparatus normally performs the plasma process on the wafer.

It is determined whether or not the target apparatus performs normally the plasma process on the wafer under the applied processing condition by comparing processing result data for a plurality of wafers that were normally processed under the applied processing condition in the reference apparatus with processing result data for a plurality of wafers that were processed under the same applied processing condition in the target apparatus. Specifically, in case the processing result data in the reference apparatus and those in the target apparatus substantially coincide with each other, it is determined that the wafers were normally processed. On the other hand, in case the processing result data in the reference apparatus and those in the target apparatus do not coincide with each other, it is determined that the wafers were not normally processed.

Further, processing parameter values (hereinafter, referred to as "normal processing parameter values"), measured in the target apparatus when the processing result data in the reference apparatus and those in the target apparatus substantially coincide with each other, are taken as references for determining whether or not the wafers are normally processed in the target apparatus (operation status of the target apparatus). For example, in a subsequent plasma process, when the processing parameter values measured in the target apparatus substantially coincide with the normal processing parameter values, it can be determined that wafers are normally processed (normal operation status), whereas when the measured processing parameter values do not coincide with the normal processing parameter values, it can be determined that wafers are not normally processed (abnormal operation status). Moreover, for accurate determination, a number of normal processing parameter values are required.

Meanwhile, there are various items of processing result data for the wafer (e.g., width or depth of a trench formed in the wafer) and various kinds of the processing parameter values (e.g., a wall temperature of the chamber and a voltage applied to the electrode), so that in comparing the processing result data in the reference apparatus with those in the target apparatus and comparing the measured processing parameter values with the normal processing parameter values, a multivariate analysis, particularly a principal component analysis, is widely used. By using the principal component analysis, the processing result data and/or the processing parameter values including a number of variables (items and kinds) can be converted into data including, e.g., one or two variables, thus making the aforementioned data comparisons easy and understandable.

As an approach using the principal component analysis, there has been known a method for evaluating an operation status of a semiconductor manufacturing apparatus (plasma processing apparatus) by executing a principal component analysis for a plurality of data monitored to calculate principal component values (the first and the second principal component value) and monitoring the principal component values in a sequence of time (see, e.g., Japanese Patent Laid-open Publication No. 2004-47885 and the corresponding U.S. patent application Publication No. 2004/0049898).

However, in order to make it possible to determine whether or not the wafers are normally processed under the applied processing condition in the target apparatus (operation status of the target apparatus), there are required processing result data for a number of wafers and many normal processing parameter values in the target apparatus. Accordingly, for determining the operation status of the target apparatus, the target apparatus should perform the plasma process under the applied processing condition in advance.

SUMMARY OF THE INVENTION

It is, therefore, an object of the present invention to provide a method and an apparatus for determining an operation status of a plasma processing apparatus, a program and a storage medium storing the program, which are capable of determining the operation status of a second plasma processing apparatus in a case where the second plasma processing apparatus is operated under a processing condition applied to a first plasma processing apparatus even though the second plasma processing apparatus does not perform in advance the plasma process under the same processing condition applied to the first plasma processing apparatus.

In accordance with a first aspect of the invention, there is provided an operation status determination method for determining an operation status of a second plasma processing apparatus when a processing condition employed in a first plasma processing apparatus is applied to the second plasma processing apparatus, the method including the steps of: (a) obtaining a first operation status data group including processing parameter values measured during a plasma process performed in accordance with a first processing condition applied to the first plasma processing apparatus; (b) obtaining a second operation status data group including processing parameter values measured during a plasma process performed in accordance with a second processing condition applied to the first plasma processing apparatus; (c) obtaining a third operation status data group including processing parameter values measured during a plasma process performed in accordance with the first processing condition applied to the second plasma processing apparatus; (d) carrying out a principal component analysis by using at least one of the first, the second and the third operation status data group obtained; (e) plotting principal component scores corresponding to two principal components selected among a plurality of principal components obtained by the principal component analysis using at least one of the first, the second and the third operation status data group in a two-dimensional coordinate system with axes of the two principal components; (f) calculating the centers of principal component score distributions respectively corresponding to the first, the second and the third operation status data group in the two-dimensional coordinate system; (g) calculating a movement vector from the center of the principal component score distribution corresponding to the first operation status data group to the center of the principal component score distribution corresponding to the third operation status data group; (h) setting an area of the principal component score distribution corresponding to the second operation status data group in the two-dimensional coordinate system; (i) by moving the area of the principal component score distribution corresponding to the second operation status data group along the movement vector, setting an area of a predicted distribution of principal component scores corresponding to two principal components of processing parameter values measured during a plasma process performed when the second processing condition is applied to the second plasma processing apparatus; and (j) by actually applying the second processing condition to the second plasma processing apparatus, determining whether or not the principal component scores corresponding to the two principal components of the processing parameter values measured during the plasma process performed in accordance with the second processing condition are included in the area of the predicted distribution.

Preferably, the center of the principal component score distribution is an average value or a central value of each of the principal component score distributions respectively corresponding to the first, the second and the third operation status data group.

Preferably, the two principal components are the first and the second principal component.

Preferably, the two principal components are selected among the plurality of principal components such that the centers of the principal component score distributions respectively corresponding to the first, the second and the third operation status data group are linearly arranged in the two-dimensional coordinate system.

Preferably, the area of the principal component score distribution corresponding to the second operation status data group is set based on a variance of the principal component scores corresponding to the second operation status data group.

Preferably, the area of the principal component score distribution corresponding to the second operation status data group is an elliptical area with axes of the two principal components.

Preferably, the processing parameter values measured during the plasma process performed in accordance with the first processing condition applied to the first plasma processing apparatus, the processing parameter values measured during the plasma process performed in accordance with the second processing condition applied to the first plasma processing apparatus and the processing parameter values measured during the plasma process performed in accordance with the first processing condition applied to the second plasma processing apparatus, are all those measured during the respective plasma processes which are normally performed.

Preferably, at the step (d), the principal component analysis is carried out by using all of the first, the second and the third operation status data group obtained.

In accordance with a second aspect of the invention, there is provided an operation status determination apparatus for determining an operation status of a second plasma processing apparatus when a processing condition employed in a first plasma processing apparatus is applied to the second plasma processing apparatus, which includes: means for obtaining a first operation status data group including processing parameter values measured during a plasma process performed in accordance with a first processing condition applied to the first plasma processing apparatus; means for obtaining a second operation status data group including processing parameter values measured during a plasma process performed in accordance with a second processing condition applied to the first plasma processing apparatus; means for obtaining a third operation status data group including processing parameter values measured during a plasma process performed in accordance with the first processing condition applied to the second plasma processing apparatus; means for carrying out a principal component analysis by using at least one of the first, the second and the third operation status data group obtained; means for plotting principal component scores corresponding to two principal components selected among a plurality of principal components obtained by the principal component analysis using at least one of the first, the second and the third operation status data group in a two-dimensional coordinate system with axes of the two principal components; means for calculating the center of principal component score distributions respectively corresponding to the first, the second and the third operation status data group in the two-dimensional coordinate system; means for calculating a movement vector from the center of the principal component score distribution corresponding to the first operation status data group to the center of the principal component score distribution corresponding to the third operation status data group; means for setting an area of the principal component score distribution corresponding to the second operation status data group in the two-dimensional coordinate system; means for, by moving the area of the principal component score distribution corresponding to the second operation status data group along the movement vector, setting an area of a predicted distribution of principal component scores corresponding to the two principal components of the processing parameter values measured during the plasma process performed when the second processing condition is applied to the second plasma processing apparatus; and means for, by actually applying the second processing condition to the second plasma processing apparatus, determining whether or not the principal component scores corresponding to the two principal components of the processing parameter values measured during the plasma process performed in accordance with the second processing condition are included in the area of the predicted distribution.

In accordance with a third aspect of the invention, there is provided a program for executing on a computer an operation status determination method for determining an operation status of a second plasma processing apparatus in a case where a processing condition employed in a first plasma processing apparatus is applied to the second plasma processing apparatus, the program including: a module for obtaining a first operation status data group including processing parameter values measured during a plasma process performed in accordance with a first processing condition applied to the first plasma processing apparatus; a module for obtaining a second operation status data group including processing parameter values measured during a plasma process performed in accordance with a second processing condition applied to the first plasma processing apparatus; a module for obtaining a third operation status data group including processing parameter values measured during a plasma process performed in accordance with the first processing condition applied to the second plasma processing apparatus; a module for carrying out a principal component analysis by using at least one of the first, the second and the third operation status data group obtained; a module for plotting principal component scores corresponding to two principal components selected among a plurality of principal components obtained by the principal component analysis using at least one of the first, the second and the third operation status data group in a two-dimensional coordinate system with axes of the two principal components; a module for calculating the center of principal component score distributions respectively corresponding to the first, the second and the third operation status data group in the two-dimensional coordinate system; a module for calculating a movement vector from the center of the principal component score distribution corresponding to the first operation status data group to the center of the principal component score distribution corresponding to the third operation status data group; a module for setting an area of the principal component score distribution corresponding to the second operation status data group in the two-dimensional coordinate system; a module for, by moving the area of the principal component score distribution corresponding to the second operation status data group along the movement vector, setting an area of a predicted distribution of principal component scores corresponding to two principal components of processing parameter values measured during a plasma process performed when the second processing condition is applied to the second plasma processing apparatus; and a module for, by actually applying the second processing condition to the second plasma processing apparatus, determining whether or not the principal component scores corresponding to the two principal components of the processing parameter values measured during the plasma process performed in accordance with the second processing condition are included in the set area of the predicted distribution.

In accordance with a fourth aspect of the invention, there is provided a storage medium storing a program for executing on a computer an operation status determination method for determining an operation status of a second plasma processing apparatus when a processing condition employed in a first plasma processing apparatus is applied to the second plasma processing apparatus, wherein the program includes: a module for obtaining a first operation status data group including processing parameter values measured during a plasma process performed in accordance with a first processing condition applied to the first plasma processing apparatus; a module for obtaining a second operation status data group including processing parameter values measured during a plasma process performed in accordance with a second processing condition applied to the first plasma processing apparatus; a module for obtaining a third operation status data group including processing parameter values measured during a plasma process performed in accordance with the first processing condition applied to the second plasma processing apparatus; a module for executing a principal component analysis by using at least one of the first, the second and the third operation status data group obtained; a module for plotting principal component scores corresponding to two principal components selected among a plurality of principal components obtained by the principal component analysis using the first, the second and the third operation status data group in a two-dimensional coordinate system with axes of the two principal components; a module for calculating the center of principal component score distributions respectively corresponding to the first, the second and the third operation status data group in the two-dimensional coordinate system; a module for calculating a movement vector from the center of the principal component score distribution corresponding to the first operation status data group to the center of the principal component score distribution corresponding to the third operation status data group; a module for setting an area of the principal component score distribution corresponding to the second operation status data group in the two-dimensional coordinate system; a module for, by moving the area of the principal component score distribution corresponding to the second operation status data group along the movement vector, setting an area of a predicted distribution of principal component scores corresponding to two principal components of processing parameter values measured during a plasma process performed when the second processing condition is applied to the second plasma processing apparatus; and a module for, by actually applying the second processing condition to the second plasma processing apparatus, determining whether or not the principal component scores corresponding to the two principal components of the processing parameter values measured during the plasma process performed in accordance with the second processing condition are included in the area of the predicted distribution.

In accordance with the present invention, the principal component scores corresponding to two principal components selected among the plural principal components obtained by the principal component analysis using the first, the second and the third operation status data group, are plotted in the two-dimensional coordinate system with the axes of the two principal components; the movement vector from the center of the principal component score distribution corresponding to the first operation status data group to the center of the principal component score distribution corresponding to the third operation status data group is calculated; the area of a predicted distribution of principal component scores corresponding to two principal components of processing parameter values measured during a plasma process performed when the second processing condition is applied to the second plasma processing apparatus is set by moving the area of the principal component score distribution corresponding to the second operation status data group in the two-dimensional coordinate system along the movement vector; and there is determined whether or not the principal component scores corresponding to the two principal components of the processing parameter values measured during the plasma process performed in accordance with the second processing condition are included in the area of the predicted distribution by actually applying the second processing condition to the second plasma processing apparatus. Accordingly, by setting the predicted normal area B2, it is possible to set a reference for determining the operation status of the second plasma processing apparatus when the second processing condition is applied thereto without carrying out the plasma processing under the second processing condition in the second plasma processing apparatus. As a result, the operation status of the second plasma processing apparatus when the processing condition of the first plasma processing apparatus is applied thereto can be determined without carrying out in advance the plasma processing under the processing condition of the first plasma processing apparatus in the second plasma processing apparatus.

Further, the centers of the principal component score distributions respectively corresponding to the first, the second and the third operation status data group for reference apparatus, the second recipe operation status data group for reference apparatus and the first recipe operation status data group for target apparatus, are the average values of the respective principal component score distributions, so that the center of the principal component score distribution can be calculated with ease, thereby making it possible to determine the operation status of the target apparatus in a short time.

Furthermore, since the two principal components are the first principal component and the second principal component, it is possible to enhance the statistical reliability of the distribution of the principal component scores corresponding to each of the operation status data groups plotted in the two-dimensional coordinate system, thereby accurately determining the operation status of the second plasma processing apparatus.

In addition, the two principal components are selected from the plural principal components such that the centers of the principal component score distributions respectively corresponding to the first, the second and the third operation status data group are linearly arranged in the two-dimensional coordinate system, so that it is possible to readily grasp the positional relations of the principal component score distributions corresponding to the respective operation status data groups, thereby making it possible to easily determine the operation status of the second plasma processing apparatus.

Moreover, since the area of the principal component score distribution corresponding to the second operation status data group is set based on the variance of the principal component scores corresponding to the second operation status data group, it is possible to enhance the statistical reliability of the area of the principal component score distribution and, therefore, the operation status of the second plasma processing apparatus can be determined more accurately.

Further, since the area of the principal component score distribution is an elliptical area with axes of the two principal components, it can be easily set to be understandable.

Furthermore, since the processing parameter values are measured during the normal plasma process, it is possible to enhance the reliability of the principal component scores corresponding to each of the operation status data groups, thereby more accurately determining the operation status of the second plasma processing apparatus.

In addition, since the principal component analysis is carried out by using all of the first, the second and the third operation status data group obtained, it is possible to enhance the statistical reliability of the two-dimensional coordinate system.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

Hereinafter, preferred embodiments of the present invention will be described in detail with reference to the accompanying drawings.

First, there will be described a plasma processing apparatus and an operation status determination apparatus to which an operation status determination method in accordance with a first preferred embodiment of the present invention is applied.

Figure 1:
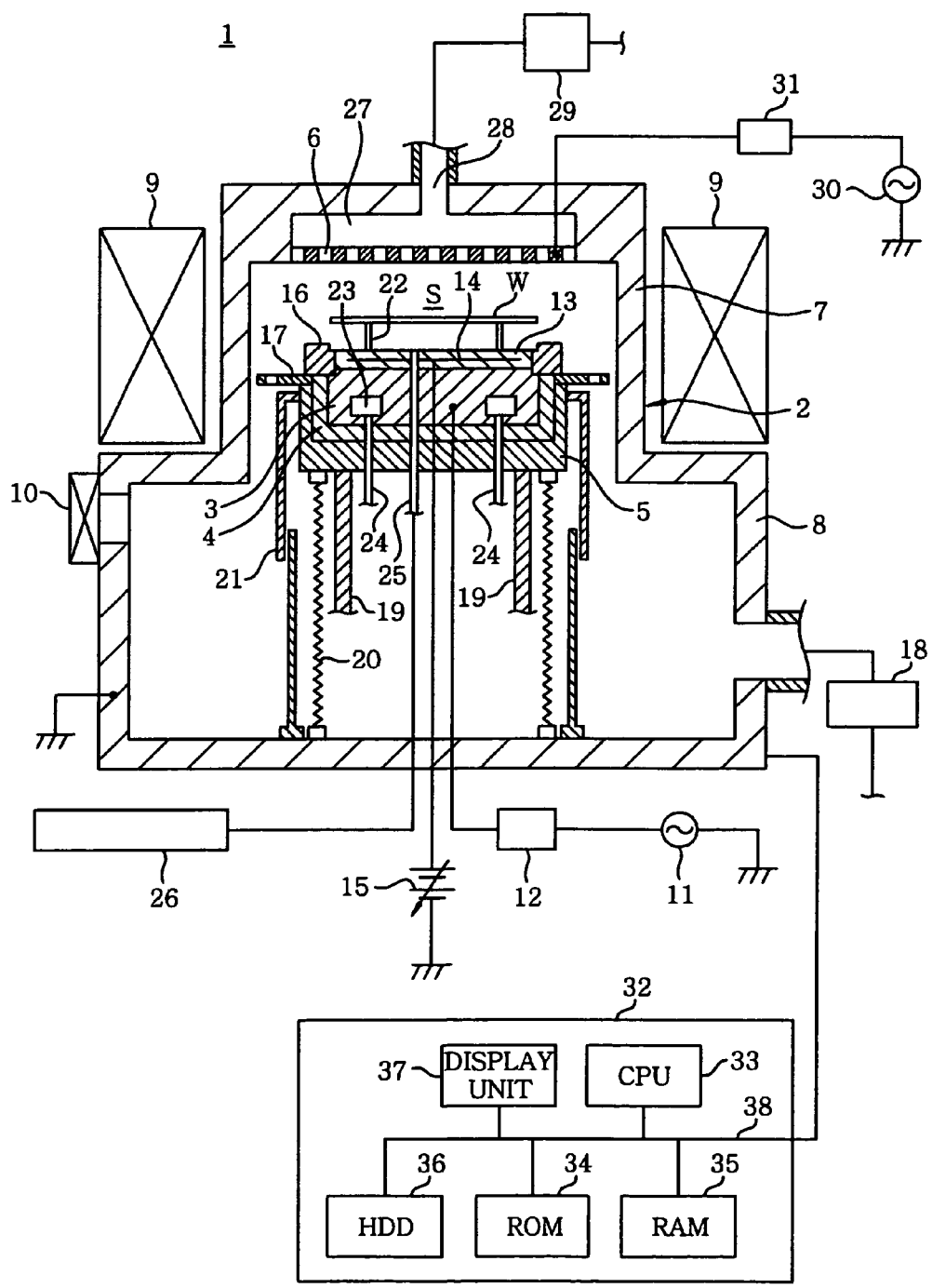
FIG. 1 is a cross sectional view schematically showing a plasma processing apparatus and an operation status determination apparatus to which an operation status determination method in accordance with a first preferred embodiment of the present invention is applied.

FIG. 1 is a cross sectional view schematically showing the plasma processing apparatus and the operation status determination apparatus to which the operation status determination method in accordance with the first preferred embodiment of the present invention is applied.

In FIG. 1, an etching processing apparatus 1, constructed as the plasma processing apparatus, includes a cylindrical chamber 2 made of, e.g., aluminum; a lower electrode 3, disposed in the chamber 2, for mounting thereon a semiconductor wafer W of, e.g., 200 mm in diameter; a vertically movable support 5 for supporting the lower electrode 3 via an insulating material 4; a shower head 6 as an upper electrode installed above the lower electrode 3 so as to face it in the chamber 2.

The chamber 2 has an upper room 7 of a smaller diameter and a lower room 8 of a larger diameter. The upper room 7 is surrounded by dipole ring magnets 9. The dipole ring magnets 9 generate a horizontal magnetic field directed in one direction as a whole in the upper room 7. A gate valve 10 for opening and closing a loading/unloading port for a semiconductor wafer W is provided at an upper portion of the lower room 8, and the etching processing apparatus 1 is connected through the gate valve 10 to an adjacent load-lock chamber (not shown) and the like. Further, a heater unit (not shown) is embedded in the sidewall of the upper room 7 to control the ambient temperature in the chamber 2, particularly in the upper room 7.

A high frequency power supply 11 is connected to the lower electrode 3 via a matching unit 12. A predetermined high frequency power is applied from the high frequency power supply 11 to the lower electrode 3. Another high frequency power supply 30 is connected via a matching unit 31 to the shower head 6 disposed at the ceiling portion of the chamber 2, and a predetermined high frequency power is applied from the high frequency power supply 30 to the shower head 6. The lower electrode 3 and the shower head 6 cooperate to generate a high-frequency electric field in a processing space S therebetween.

Disposed on a top surface of the lower electrode 3 is an electrostatic chuck 13 for attracting and holding the semiconductor wafer W by an electrostatic attraction force. A disc-shaped electrode plate 14 formed of a conductive film is disposed inside the electrostatic chuck 13, and a DC power supply 15 is electrically connected to the electrode plate 14. The semiconductor wafer W is attractively held on the top surface of the electrostatic chuck 13 by Coulomb force or Johnsen-Rahbek force produced due to the DC voltage from the DC power supply 15 applied to the electrode plate 14.

An annular focus ring 16 is disposed around the electrostatic chuck 13 to surround the peripheral edge of the semiconductor wafer W attracted and held on the electrostatic chuck 13. The focus ring 16 is made of silicon carbide or quartz, so that it has a substantially same conductivity as that of the semiconductor wafer W. Accordingly, the focus ring 16 efficiently draws a plasma generated in the chamber 2, which will be described later, toward the semiconductor wafer W.

Between the sidewall of the upper room 7 and the lower electrode 3, there is formed a gas exhaust passageway through which a gas present above the lower electrode 3 is discharged to the outside of the chamber 2, and an annular baffle plate 17 is placed at the middle of the gas exhaust passageway. The downstream space (inner space of the lower room 8) of the gas exhaust passageway below the baffle plate 17 communicates with an automatic pressure control valve (hereinafter, referred to as "APC valve") which is a variable butterfly valve. The APC valve 18 is connected to a turbo molecular pump (hereinafter, referred to as "TMP") (not shown) which is a vacuum suction exhaust pump, and the TMP is connected to a dry pump (hereinafter, referred to as "DP") (not shown). A gas exhaust unit including the APC 18, the TMP and the DP controls the inner pressure of the chamber 2 by using the APC 18 and depressurizes the inside of the chamber 2 to a substantial vacuum state by using the TMP and DP.

Below the lower electrode 3, there is installed a lower electrode elevating mechanism including ball screws 19 downwardly extending from the bottom surface of the support 5. The lower electrode elevating mechanism supports the lower electrode 3 through the support 5 and moves the lower electrode 3 up and down by rotating the ball screws 19 with motors. (not shown). The lower electrode elevating mechanism is isolated from the ambience in the chamber 2 by a bellows 20 disposed therearound and a bellows cover 21 disposed around the bellows 20.

A plurality of pusher pins 22 are installed in the lower electrode 3 to be freely protruded from the top surface of the electrostatic chuck 13. The pusher pins 22 move up and down as in FIG. 1. In such an etching processing apparatus 1, when the semiconductor wafer W is loaded or unloaded, the lower electrode 3 is lowered to the loading/unloading position of the semiconductor wafer W and the pusher pins 22 are protruded from the top surface of the electrostatic chuck 13 to lift the semiconductor wafer W spaced apart from the lower electrode 3. Further, when the semiconductor wafer W is etched, the lower electrode 3 is lifted up to the processing position for the semiconductor wafer W and the pusher pins 22 are retreated in the lower electrode 3, so that the semiconductor wafer W is attracted and held by the electrostatic chuck 13.

Further, in the lower electrode 3, there is formed an annular coolant path 23 circumferentially extending, for example. A coolant, e.g., cooling water, of a predetermined temperature is supplied from a chiller unit (not shown) through a conduit 24 to the coolant path 23 to be circulated therein, so that the processing temperature of the semiconductor wafer W mounted on the lower electrode 3 is controlled by the temperature of the coolant.

On the top surface of the electrostatic chuck 13, a plurality of holes and grooves (not shown) are arranged such that a thermally conductive gas is supplied therethrough. These thermally conductive gas supply holes and grooves are connected to a thermally conductive gas supply unit 26 through a thermally conductive gas feeding line installed in the lower electrode 3, so that the thermally conductive gas supply unit 26 supplies a thermally conductive gas, e.g., He gas, into the gap between the electrostatic chuck 13 and the semiconductor wafer W, thereby enhancing the thermal conductivity between the semiconductor wafer W and the electrostatic chuck 13. The thermally conductive gas supply unit 26 is also configured such that it can vacuum suction the gap between the electrostatic chuck 13 and the semiconductor wafer W.

A buffer space 27 is provided above the shower head 6, and a processing gas feeding line 28 from a processing gas supply unit (not shown) is connected to the buffer space 27. An MFC 29 is installed at the middle of the processing gas feeding line 28. The MFC 29 supplies a predetermined gas, e.g., a processing gas or $N_2$ gas, into the chamber 2 through the buffer space 27 and the shower head 6, and controls a flow rate of the gas so that the pressure in the chamber 2 is controlled to be kept at a desired value by the cooperation of the MFC 29 and the aforementioned gas exhaust unit.

In the chamber 2 of the etching processing apparatus 1, as described above, the high-frequency powers are applied to the lower electrode 3 and the shower head 6, respectively, and a high density plasma is generated from the processing gas in the processing space S due to the application of the high-frequency powers to produce ions and radicals.

In the etching processing apparatus, upon the etching process, the gate valve 10 is first opened and a semiconductor wafer W to be processed is loaded into the chamber 2. Then, a processing gas (a gaseous mixture containing at least one of oxygen ($O_2$) gas and carbon tetra fluoride ($CF_4$) gas at a predetermined flow rate ratio) is introduced into the chamber 2 at a predetermined flow rate and flow rate ratio to set the pressure in the chamber 2 at a predetermined level by using the gas exhaust unit. Further, the high-frequency power from the high-frequency power supply 11 is applied to the lower electrode 3 while the high-frequency power from the high-frequency power supply 30 is applied to the shower head 6, and the DC voltage from the DC power supply 15 is applied to the electrode plate 14, thereby attracting and holding the semiconductor wafer W on the lower electrode 3. Then, the processing gas injected through the shower head 6 is converted into plasma as described above. Such plasma is focused toward the surface of the semiconductor wafer W by the focus ring 16, and the surface of the semiconductor wafer W is physically etched by ions, e.g., fluorine ions and oxygen ions produced by the plasma.

The etching processing apparatus 1 includes a plurality of sensors (not shown) for measuring at real time output values of the aforementioned components, e.g., a wall temperature of the upper room 7, a power applied to the lower electrode 3 and an opening degree of the APC valve 18. The sensors measure the output values of the components as processing parameter values during the etching process, and send the measured processing parameters to a system controller 32 which will be described later.

The system controller (operation status determination apparatus) 32 is a general server for controlling a plasma processing system including the etching processing apparatus 1, the load-lock chamber and the like. The system controller 32 includes a bus 38 connected to the etching processing apparatus 1, the load-lock chamber and the like, the bus connecting CPU 33, ROM 34, RAM 35, HDD 36 as a recording device, a display unit 37 and each of the components with one another. Further, the system controller 32 controls the operation of each component of the etching processing apparatus 1.

The ROM 34 stores a program for executing the etching process in the etching processing apparatus 1, a program for executing the operation status determination method for determining the operation status of the etching processing apparatus 1 which will be described later, a program for executing various statistic processes, e.g., multivariate analyses (a principal component analysis and a regression analysis), and the like. The RAM 35 is a recordable memory, and each of the programs is loaded thereon from the ROM 34. Further, the RAM 35 is also used as a work area when the CPU 33 executes each of the processes in accordance with the loaded programs.

The HDD 36 stores the processing parameters transmitted from the sensors of the etching processing apparatus 1 as apparatus log data of the etching processing apparatus 1. Since the apparatus log data are stored whenever a semiconductor wafer W is processed, a large amount of apparatus log data are present in the HDD 36 and, among the apparatus log data, those corresponding to a same etching process form a same operation status data group. Further, the HDD 36 may store each of the programs. The CPU 33 transmits and receives addresses and data to and from the ROM 34, the RAM 35 and the HDD 36 via the bus 38, and performs each process by executing the programs loaded on the RAM 35.

The display unit 37 is formed of, e.g., a liquid crystal display (LCD) and displays the operation status of each component of the etching processing apparatus 1. Further, the display unit 37 also serves as an input unit that receives input from an operator and through which the operator can take out a program corresponding to a desired process and input a demand to execute the very program.

Hereinafter, there will be described an operation status determination method in accordance with a first embodiment of the present invention.

Typically, the etching processing apparatus can perform various etching processes on a semiconductor wafer. However, in case the etching processing apparatus performs a specified etching process which has never been carried out thereby, other etching processing apparatus that has the same specification as that of the very etching processing apparatus and has already performed the specified etching process normally on a semiconductor wafer (hereinafter, referred to as "reference apparatus") is searched, and a processing condition (e.g., a flow rate ratio of the processing gas and/or an application time of the high-frequency power) (hereinafter, referred to as "recipe") corresponding to the specified etching process in the reference apparatus are applied to the etching processing apparatus. The etching processing apparatus to which the recipe employed in the reference apparatus (hereinafter, referred to as "applied recipe") is applied will be referred to as "target apparatus" hereinafter.

However, even in the etching processing apparatuses having the same specification, there exist between the components of the respective etching processing apparatuses various deviations, e.g., deviation in dimension and/or attachment of the focus ring, difference in responsiveness of the matching unit, difference (deviation) in capability of finely controlling the gas flow rate, difference in temperature control capability due to difference in performance of the heater unit and/or difference in capability of supplying circulated cooling water, difference in gas exhaust capability of the TMP and/or the DP, and difference in worn amount of wearable components disposed in the chamber. Accordingly, there occur differences between the etching processing apparatuses, so that the etching results for the semiconductor wafers (e.g., widths and/or depths of trenches formed therein) in the respective etching processing apparatuses may be different even when a same recipe is applied to the etching processing apparatuses. Therefore, even though the applied recipe is employed in the target apparatus, it cannot be guaranteed that the specified etching process can always be normally performed on the semiconductor wafer. So, in case the applied recipe is employed in the target apparatus, it is necessary to determine whether or not the specified etching process has been normally performed on the semiconductor wafer to thereby determine whether the operation status of the target apparatus is normal or abnormal.

Meanwhile, as described above, the system controller connected to each of the etching processing apparatuses stores a large amount of processing parameter values for various etching processes as apparatus log data for the respective etching processing apparatuses. Further, the large amount of apparatus log data stored are classified based on same recipe to form same operation status data groups corresponding to the respective recipes. Accordingly, in determining whether the operation status of the target apparatus is normal or abnormal, it can be considered to use the operation status data groups for the target apparatus and the reference apparatus.

Here, in the operation status data groups, apparatus log data (processing parameter values) are divided into several sets for each same semiconductor wafer. The processing parameter values divided into the several sets are referred to as "single-wafer processing parameter set" hereinafter. For example, if K kinds of processing parameter values (e.g., the wall temperature of the chamber and the voltage applied to the electrode) are measured for each semiconductor wafer, K number of processing parameter data are included in one single-wafer processing parameter set.

Since there are various kinds of the processing parameter values (e.g., the wall temperature of the chamber and the voltage applied to the electrode) in the operation status data group, it is difficult to use the operation status data group as they are. Therefore, in the operation status determination method in accordance with this embodiment, there is used the principal component analysis which is a multivariate analysis.

The principal component analysis is a method of converting multiple variates (the processing parameter values in this embodiment) into principal components which are a few numbers of aggregated indices while suppressing the loss of information. The principal components are obtained by linearly converting original variate, wherein a principal component most reflecting the information on the original variate (i.e., a principal component whose dispersion becomes maximum) is set as a first principal component and a principal component orthogonal to the first principal component whose dispersion is great next to that of the first principal component is set as a second principal component.

In this embodiment, for example, in a case where N sheets of semiconductor wafers are etched in accordance with a first recipe in the reference apparatus, there are N number of single-wafer processing parameter sets in one operation status data group. The processing parameter values may vary with time during the etching process, so that there is used in this embodiment an average value of the processing parameter values in the etching process. If the processing parameter values are set as x and the number of the processing parameter values measured for each semiconductor wafer is set as K (that is, K kinds of processing parameter values are measured for each semiconductor wafer), one operation status data group is expressed by a matrix X as the following equation 1-1.

$$X = \begin{bmatrix} x_{11} & x_{12} & \cdots & x_{1K} \\ x_{21} & x_{22} & \cdots & x_{2K} \\ \vdots & \vdots & \cdots & \vdots \\ x_{N1} & x_{N2} & \cdots & x_{NK} \end{bmatrix} \quad \text{Eq. 1-1}$$

Subsequently, in the operation status data group X, an average value, a maximum value, a minimum value and a variance for each kind of processing parameter values (e.g., an average value, a maximum value, a minimum value and a variance for N number of voltages applied to the electrode) are calculated. Thereafter, by using a variance-covariance matrix based on the calculated values, there are calculated eigenvalues of principal components for the K kinds of processing parameter values and eigenvectors thereof. Here, there are obtained the principal components of K numbers equal to the number of the kinds of the processing parameter values in one single-wafer processing parameter set.

The eigenvalue indicates the magnitude of the variance of each principal component, and the principal components are defined in the decreasing order of the eigenvalue as the first principal component, the second principal component, . . . the $a^{th}$ principal component, . . . and the $K^{th}$ principal component. Further, each of the eigenvalues has an eigenvector (loading vector) corresponding thereto. In general, as the degree of the principal component increases, a contribution rate indicating a degree that reflects information on the processing parameter values becomes lower and the usefulness thereof decreases. Accordingly, for the statistically highly reliable analysis, it is preferable to use the principal components of lower degree (e.g., the first and the second principal component).

Further, in the operation status data group X, the values of the respective principal components in each single-wafer processing parameter set are referred to as principal component scores. For example, in the operation status data group X, the $a^{th}$ principal component score corresponding to the $n^{th}$ single-wafer processing parameter set is expressed as the following Eq. 1-2.

$$t_{na} = X_{n1}P_{1a} + X_{n2}P_{2a} + \ldots + X_{nK}P_{Ka} \quad \text{Eq. 1-2}$$

where $P_{na}$ (n=1, 2, . . . , K) indicates each component of the eigenvector (loading vector) corresponding to the $a^{th}$ principal component.

In case the single-wafer processing parameter sets of the operation status data group X are converted into the respective principal component scores, the vector (score vector) $t_a$ of the converted $a^{th}$ principal component score and the matrix (score matrix) $T_a$ of all the principal component scores are expressed by the following Eq. 1-3.

$$t_a = \begin{bmatrix} t_{1a} \\ t_{2a} \\ \vdots \\ t_{Na} \end{bmatrix}, T_a = \begin{bmatrix} x_{11} & x_{12} & \cdots & x_{1a} \\ x_{21} & x_{22} & \cdots & x_{2a} \\ \vdots & \vdots & \vdots & \vdots \\ x_{N1} & x_{N2} & \cdots & x_{Na} \end{bmatrix} (a = 1, 2, \ldots, K) \quad \text{Eq. 1-3}$$

In the operation status determination method in accordance with this embodiment, among the vectors of the converted principal component scores, the vectors of two arbitrary principal component scores are selected to be used. Further, in the operation status determination method of this embodiment, in case a large number of semiconductor wafers are normally etched in accordance with each of the first and the second recipe in the reference apparatus and a large number of semiconductor wafers are normally etched in accordance with the first recipe in the target apparatus, the operation status of the target apparatus is determined when the second recipe is applied thereto.

Accordingly, before the operation status determination method of this embodiment is conducted, there are stored in the HDD 36 of the system controller 32 an operation status data group including processing parameter values (apparatus log data) measured while the reference apparatus performs the etching process on a large number of semiconductor wafers in accordance with the first recipe (hereinafter, referred to as "first recipe operation status data group for reference apparatus") (first operation status data group), an operation status data group including processing parameter values measured while the reference apparatus performs the etching process on a large number of semiconductor wafers in accordance with the second recipe (hereinafter, referred to as "second recipe operation status data group for reference apparatus") (second operation status data group), and an operation status data group including processing parameter values measured while the target apparatus performs the etching process on a large number of semiconductor wafers in accordance with the first recipe (hereinafter, referred to as "first recipe operation status data group for target apparatus") (third operation status data group).

In each of the etching processes described above, there are measured values for 16 kinds of processing parameters per each semiconductor wafer, so that each single-wafer processing parameter set in each operation status data group includes 16 processing parameter values. Further, the measured processing parameters include, e.g., an amount of the high-frequency power reflected by the upper electrode (absolute value), an amount of the high-frequency power reflected by the lower electrode (absolute value), a voltage applied to the lower electrode, a temperature of the upper electrode, a temperature of the lower electrode, an opening degree of the APC valve, a wall temperature of the upper room, a current applied to the electrostatic chuck, a capacitance of the matching unit and an inductance of the matching unit. In addition, the number of the kinds of the processing parameters measured for each semiconductor wafer is not limited to 16, and the kinds of the processing parameters measured for each semiconductor wafer are not limited to the above.

Figure 2:
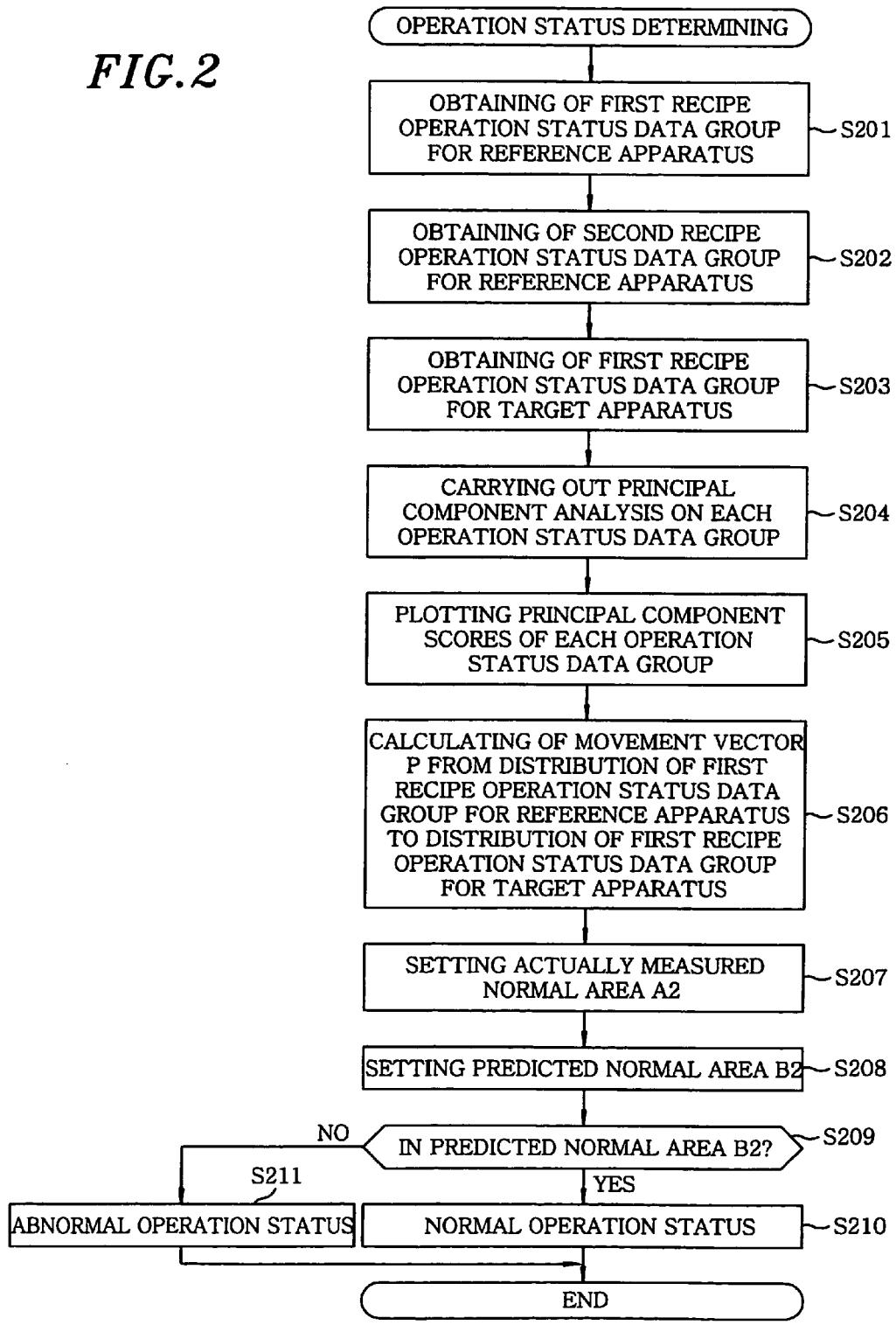
FIG. 2 illustrates a flow chart of the operation status determination method of the first preferred embodiment.

FIG. 2 shows a flow chart of the operation status determination method in accordance with the first preferred embodiment. The process corresponding to the method is executed by the CPU 33 in accordance with the program loaded in the RAM 35 in response to the operator's input through the display unit 37.

In FIG. 2, first, the first recipe operation status data group for reference apparatus stored in the HDD 36 is obtained (step S201) and, then, the second recipe operation status data group for reference apparatus and the first recipe operation status data group for target apparatus are obtained (steps S202 and S203).

Subsequently, the principal component analysis is carried out by using all of the first recipe operation status data group for reference apparatus, the second recipe operation status data group for reference apparatus and the first recipe operation status data group for target apparatus to calculate an eigenvalue and an eigenvector of each principal component (step S204).

Figure 3:
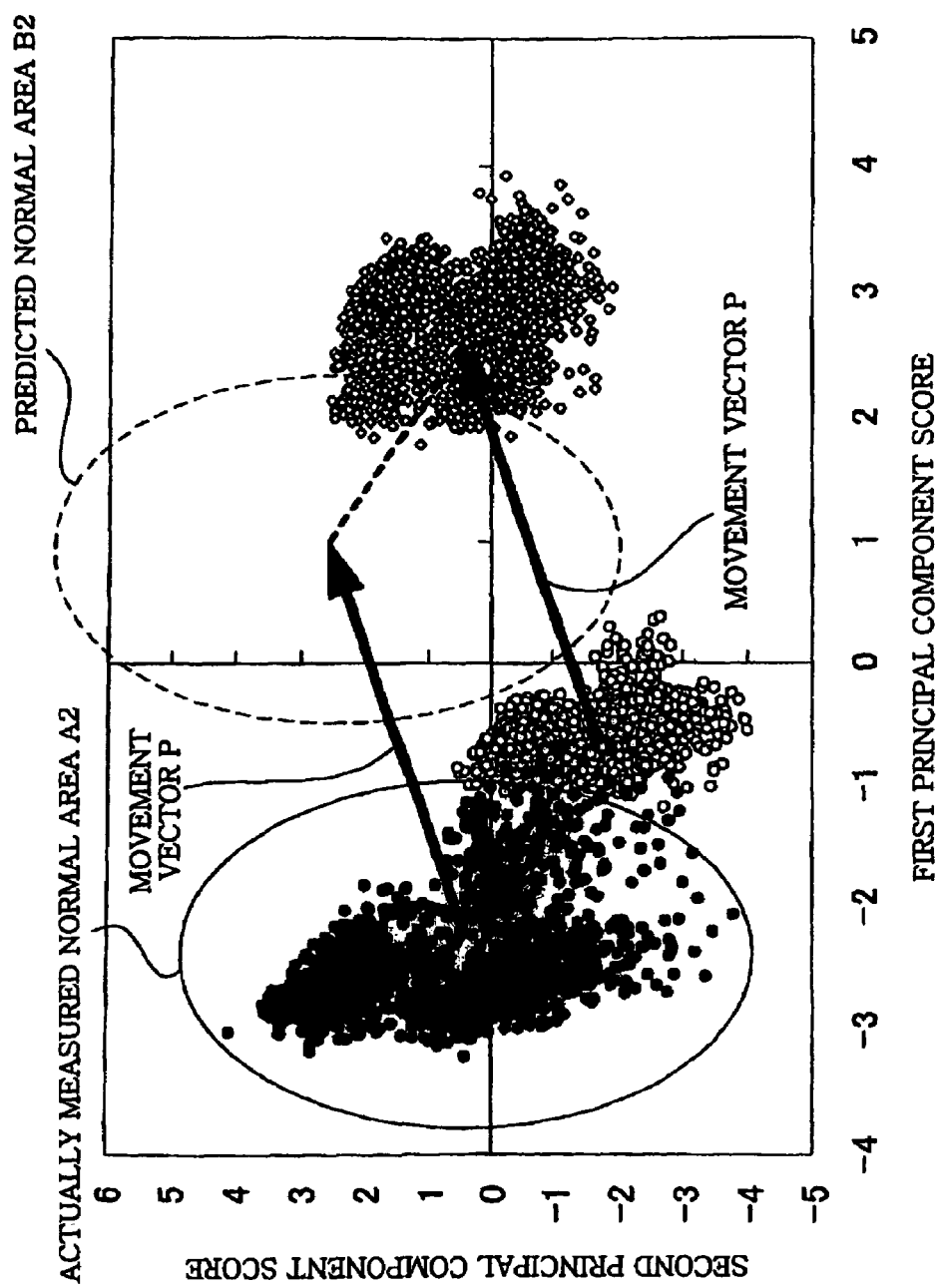
FIG. 3 provides a graph for explaining a process of setting a predicted normal area B2 in the operation status determination method of the first preferred embodiment.

Next, the first and the second principal component are selected among 16 principal components obtained as the result of the principal component analysis at the step S204, and by using eigenvectors corresponding to the first and the second principal component, each of the single-wafer processing parameter sets in each operation status data group is converted into the first and the second principal component score as given in Eq. 1-2. Then, as shown in FIG. 3, the first and the second principal component score converted are plotted in a two-dimensional coordinate system wherein the X and Y axes respectively represent the first and the second principal component (step S205). In FIG. 3, the principal component scores corresponding to the first recipe operation status data group for reference apparatus are indicated by "○", the principal component scores corresponding to the second recipe operation status data group for reference apparatus are indicated by "●", and the principal component scores corresponding to the first recipe operation status data group for target apparatus are indicated by "◇".

Subsequently, an average value of the first and the second principal component scores in the distribution of the principal component scores corresponding to the first recipe operation status data group for reference apparatus plotted in the two-dimensional coordinate system is calculated as the center of the distribution, and, similarly, an average value of the first and the second principal component scores in the distribution of the principal component scores corresponding to the second recipe operation status data group for reference apparatus and an average value of the first and the second principal component scores in the distribution of the principal component scores corresponding to the first recipe operation status data group for target apparatus are calculated as the centers of the distributions, respectively.

Then, a movement vector from the center of the principal component score distribution corresponding to the first recipe operation status data group for reference apparatus to the center of the principal component score distribution corresponding to the first recipe operation status data group for target apparatus is calculated (step S206), and an area A2 of the principal component score distribution corresponding to the second recipe operation status data group for reference apparatus (hereinafter, referred to as "actually measured normal area A2") is set in the two-dimensional coordinate system (step S207). The actually measured normal area A2 is an elliptical area, and the major axis and the minor axis of the ellipse are set based on the variance of the first and the second principal component scores in the second recipe operation status data group for reference apparatus. Specifically, the standard deviations of the first and the second principal component scores in the second recipe operation status data group for reference apparatus are respectively set as $\sigma_1$ and $\sigma_2$, the ellipse of the actually measured normal area A2 takes as its center the center of the principal component score distribution corresponding to the second recipe operation status data group for reference apparatus, and the major and the minor axis thereof are of $6\sigma_1$ and $6\sigma_2$ in length.

Thereafter, in the two-dimensional coordinate system, the actually measured normal area A2 is moved along the movement vector P, and the actually measured normal area A2 moved is set as a predicted normal area B2 (step S208). Here, since it is considered that the movement vector P indicates a transition amount of each of the processing parameter values in a case where the reference apparatus is replaced with the target apparatus employing the same recipe as that thereof, it can be regarded that the predicted normal area B2 predicts the distribution of the principal component scores (the first and the second principal component scores) in a case where the reference apparatus employing the second recipe is substituted with the target apparatus employing the second recipe.

Then, the second recipe is actually applied to the target apparatus to perform the etching process on the semiconductor wafer in accordance with the second recipe, and 16 kinds of processing parameter values are measured during the etching process to obtain a single-wafer processing parameter set. Furthermore, the obtained single-wafer processing parameter set is converted into the first and the second principal component scores by using the eigenvectors respectively corresponding to the first and the second principal component, and it is determined whether or not points corresponding to the first and the second principal component scores converted (hereinafter, referred to as "determination points") are included in the predicted normal area B2 in the two-dimensional coordinate system shown in FIG. 3 (step S209).

In case the determination points are determined to be included in the predicted normal area B2 at the step S209, it is determined that the target apparatus normally performs the etching process on the semiconductor wafer in accordance with the second recipe and the operation status of the target apparatus employing the second recipe is normal (step S210), and the process is completed.

On the other hand, in case the target points are determined not to be included in the predicted normal area B2 at the step S209, it is determined that the target apparatus does not normally perform the etching process on the semiconductor wafer in accordance with the second recipe and the operation status of the target apparatus employing the second recipe is abnormal (step S211), and the process is completed.

In accordance with the operation status determination method of this embodiment, the principal component scores (the first and the second principal component scores) corresponding to the first and the second principal component obtained by the principal component analysis (step S204) using the first recipe operation status data group for reference apparatus, the second recipe operation status data group for reference apparatus and the first recipe operation status data group for target apparatus, are plotted in the two-dimensional coordinate system with the axes of the first and the second principal component (step S205); the movement vector P from the center of the principal component score distribution corresponding to the first recipe operation status data group for reference apparatus to the center of the principal component score distribution corresponding to the first recipe operation status data group for target apparatus is calculated (step S206); the predicted normal area B2 is set by moving the actually measured normal area A2 set in the two-dimensional coordinate system along the calculated movement vector P (step S208); and the second recipe is actually applied to the target apparatus and it is determined whether or not the first and the second principal component scores of the single-wafer processing parameter set including the processing parameter values measured during the etching process performed in accordance with the second recipe are included in the predicted normal area B2 (step S209). Since the movement vector P indicates the transition amount of each of the processing parameter values in the case where the reference apparatus is replaced with the target apparatus employing the same recipe as that thereof, the predicted normal area B2 predicts the distribution of the principal component scores (the first and the second principal component scores) in the case where the reference apparatus employing the second recipe is substituted with the target apparatus employing the second recipe. Accordingly, by setting the predicted normal area B2, it is possible to set a reference for determining the operation status of the target apparatus when the second recipe is applied thereto without carrying out the etching process in accordance with the second recipe in the target apparatus. As a result, the operation status of the target apparatus when the second recipe is applied thereto can be determined without carrying out in advance the etching process in accordance with the second recipe in the target apparatus.

Figure 4:
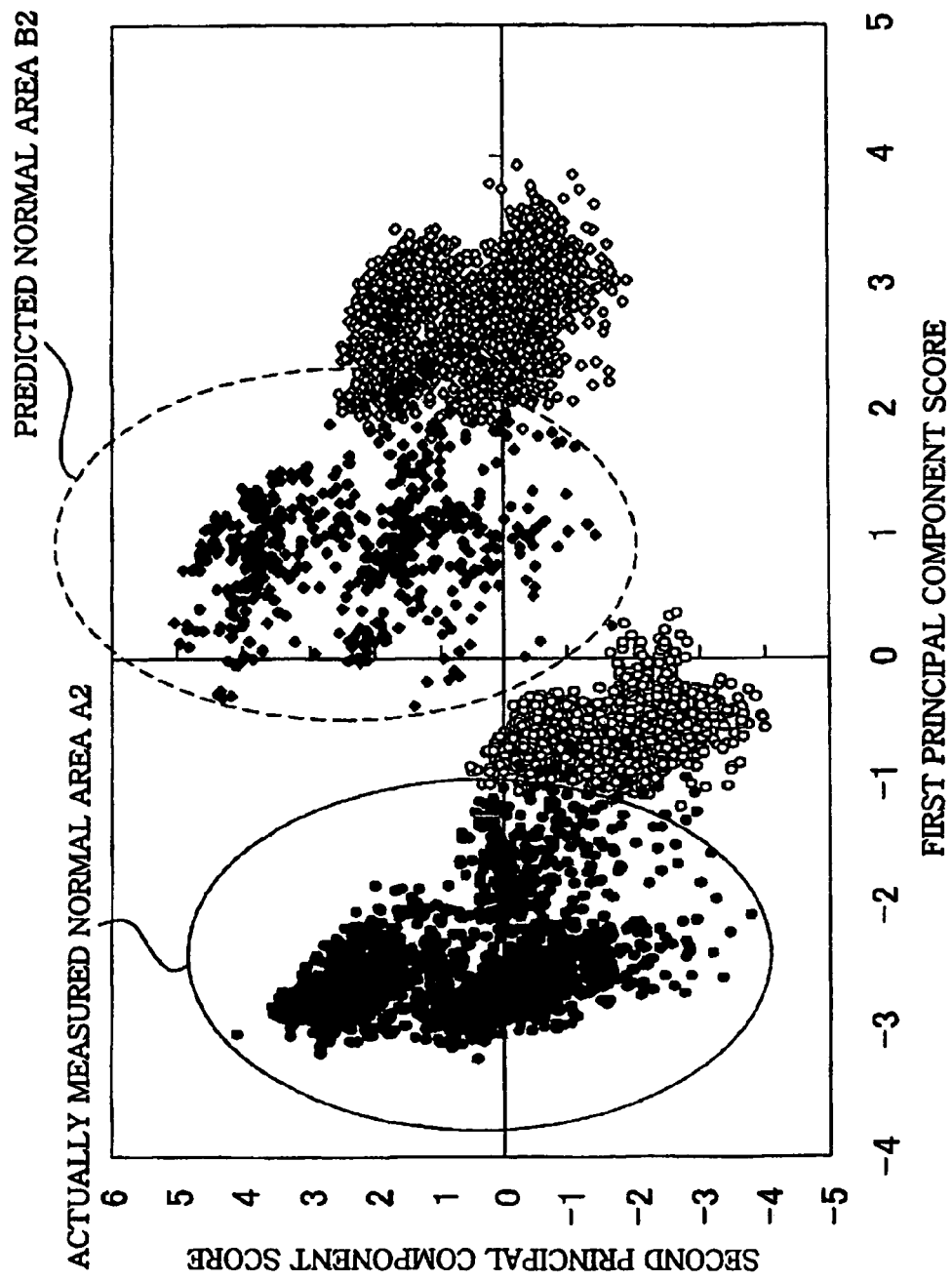
FIG. 4 presents a graph showing a relationship between the predicted normal area B2 set in the operation status determination method of the first preferred embodiment and a principal component score distribution corresponding to a second recipe operation status data group for target apparatus.

Further, in order to confirm the accuracy of the operation status determination method of this embodiment, the inventors obtained an operation status data group including a large number of single-wafer processing parameter sets in a case where a normal etching process is performed on a large number of semiconductor wafers by applying the second recipe to the target apparatus (hereinafter, referred to as "second recipe operation status data group for target apparatus"). Furthermore, the large number of single-wafer processing parameter sets in the second recipe operation status data group for target apparatus were converted into the first and the second principal component scores, and the first and the second principal component scores were plotted in the two-dimensional coordinate system by using "♦" as shown in FIG. 4. As a result, it was confirmed that the second recipe operation status data group for target apparatus was substantially included in the predicted normal area B2. In this way, it has been found that it is possible to accurately determine the operation status of the target apparatus when the second recipe is applied thereto by using the predicted normal area B2.

In the operation status determination method of this embodiment as described above, the centers of the principal component score distributions respectively corresponding to the first recipe operation status data group for reference apparatus, the second recipe operation status data group for reference apparatus and the first recipe operation status data group for target apparatus, are the average values of the respective principal component score distributions, so that the center of the principal component score distribution can be calculated with ease, thereby making it possible to determine the operation status of the target apparatus in a short time. Further, the central value of each principal component score distribution may be calculated as the center of the principal component score distribution, and in this case, the same effects can be obtained.

In the operation status determination method of this embodiment as described above, the two-dimensional coordinate system has the first principal component axis and the second principal component axis, so that it is possible to enhance the statistical reliability of the distribution of the principal component scores corresponding to each of the operation status data groups plotted in the two-dimensional coordinate system, thereby accurately determining the operation status of the target apparatus.

In the operation status determination method of this embodiment as described above, the actually measured normal area A2 is set based on the variances of the first and the second principal component scores corresponding to the second recipe operation status data group for reference apparatus, so that it is possible to enhance the statistical reliability of the actually measured normal area A2 and the operation status of the target apparatus can be determined more accurately. Further, the actually measured normal area A2 is an elliptical area having the first principal component axis and the second principal component axis, so that it can be easily set to be understandable.

Moreover, in the operation status determination method of this embodiment as described above, all of the processing parameter values in the first recipe operation status data group for reference apparatus, the second recipe operation status data group for reference apparatus and the first recipe operation status data group for target apparatus are the ones measured in the case where the etching process is normally performed on the semiconductor wafers, so that it is possible to enhance the reliability of the principal component scores corresponding to each of the operation status data groups, thereby more accurately determining the operation status of the target apparatus.

Furthermore, in the operation status determination method of this embodiment as described above, the principal component analysis is carried out by using all of the first recipe operation status data group for reference apparatus, the second recipe operation status data group for reference apparatus and the first recipe operation status data group for target apparatus which have been obtained, so that it is possible to enhance the statistical reliability of the two-dimensional coordinate system.

Furthermore, in the operation status determination method of this embodiment as described above, if the first and the second principal component scores converted from the single-wafer processing parameter set obtained by actually applying the second recipe to the target apparatus to perform the etching process in accordance with the second recipe are not included in the predicted normal area B2, the operation status of the target apparatus is immediately determined to be abnormal. However, in case a plurality of single-wafer processing parameter sets are obtained, the operation status of the target apparatus may be determined to be abnormal only if a predetermined part of the first and the second principal component scores converted from the plurality of single-wafer processing parameter sets is not included in the predicted normal area B2.

Figure 5:
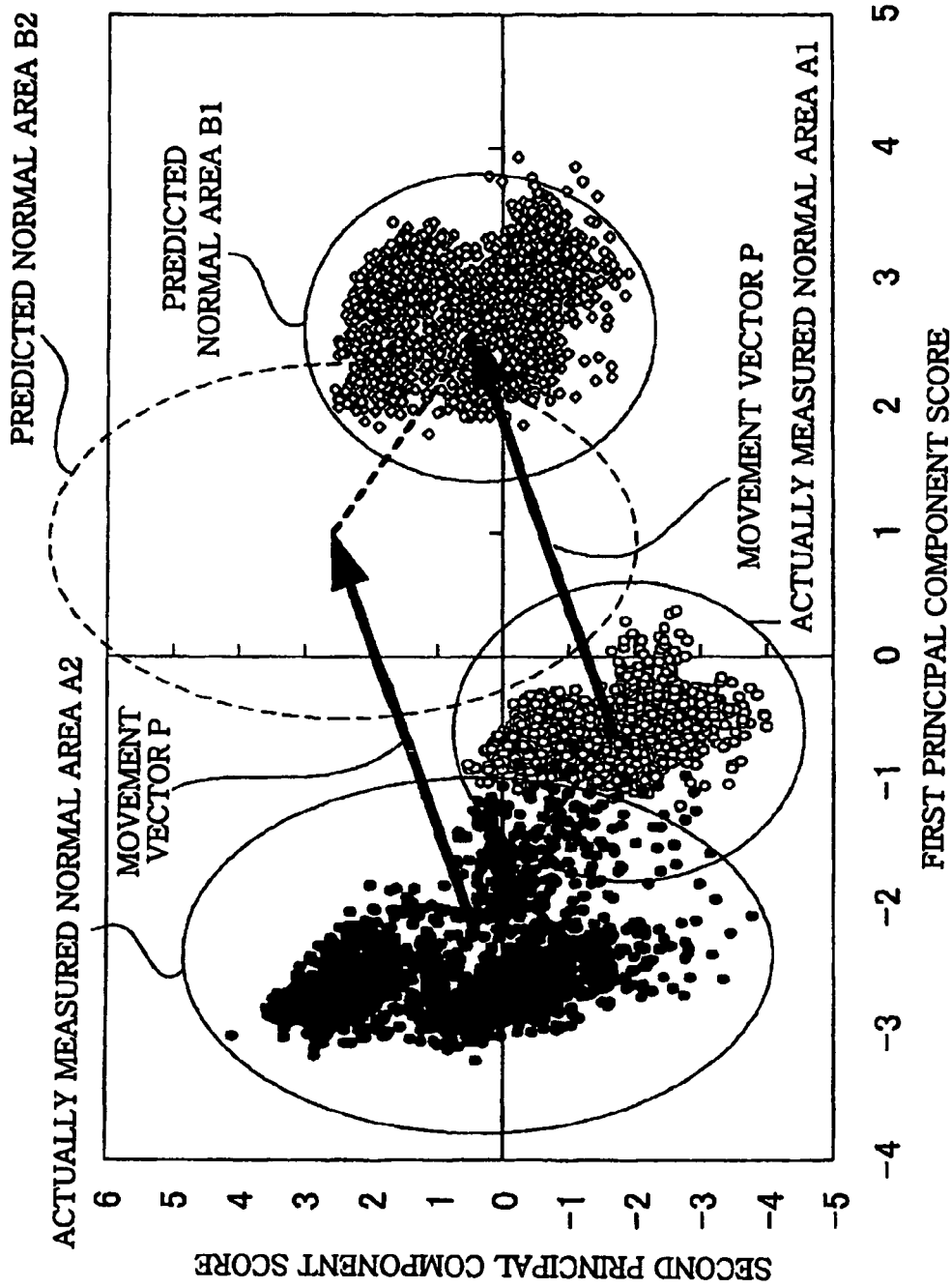
FIG. 5 represents a graph for explaining a first modification of the process for setting the predicted normal area B2 in the operation status determination method of the first preferred embodiment.

In the operation status determination method of this embodiment as described above, although the movement vector P is calculated on the basis of the center of the principal component score distribution corresponding to the first recipe operation status data group for reference apparatus and the center of the principal component score distribution corresponding to the first recipe operation status data group for target apparatus, the calculating way of the movement vector P is not limited thereto. For example, as shown in FIG. 5, after setting in the two-dimensional coordinate system an area A1 of the principal component score distribution corresponding to the first recipe operation status data group for reference apparatus (hereinafter, referred to as "actually measured normal area A1") and an area B1 of the principal component score distribution corresponding to the first recipe operation status data group for target apparatus (hereinafter, referred to as "actually measured normal area B1") and adjusting the actually measured normal areas A1 and B1 such that their areas become equal to each other, the movement vector P may be calculated based on the centers (gravity centers) of the actually measured normal areas A1 and B1 adjusted. In this way, it is possible to remove from the movement vector P the influence of the difference in configuration between the principal component score distributions respectively corresponding to the first recipe operation status data group for reference apparatus and the first recipe operation status data group for target apparatus, so that the statistical reliability of the predicted normal area B2 set by using the movement vector P can be enhanced.

Figure 6:
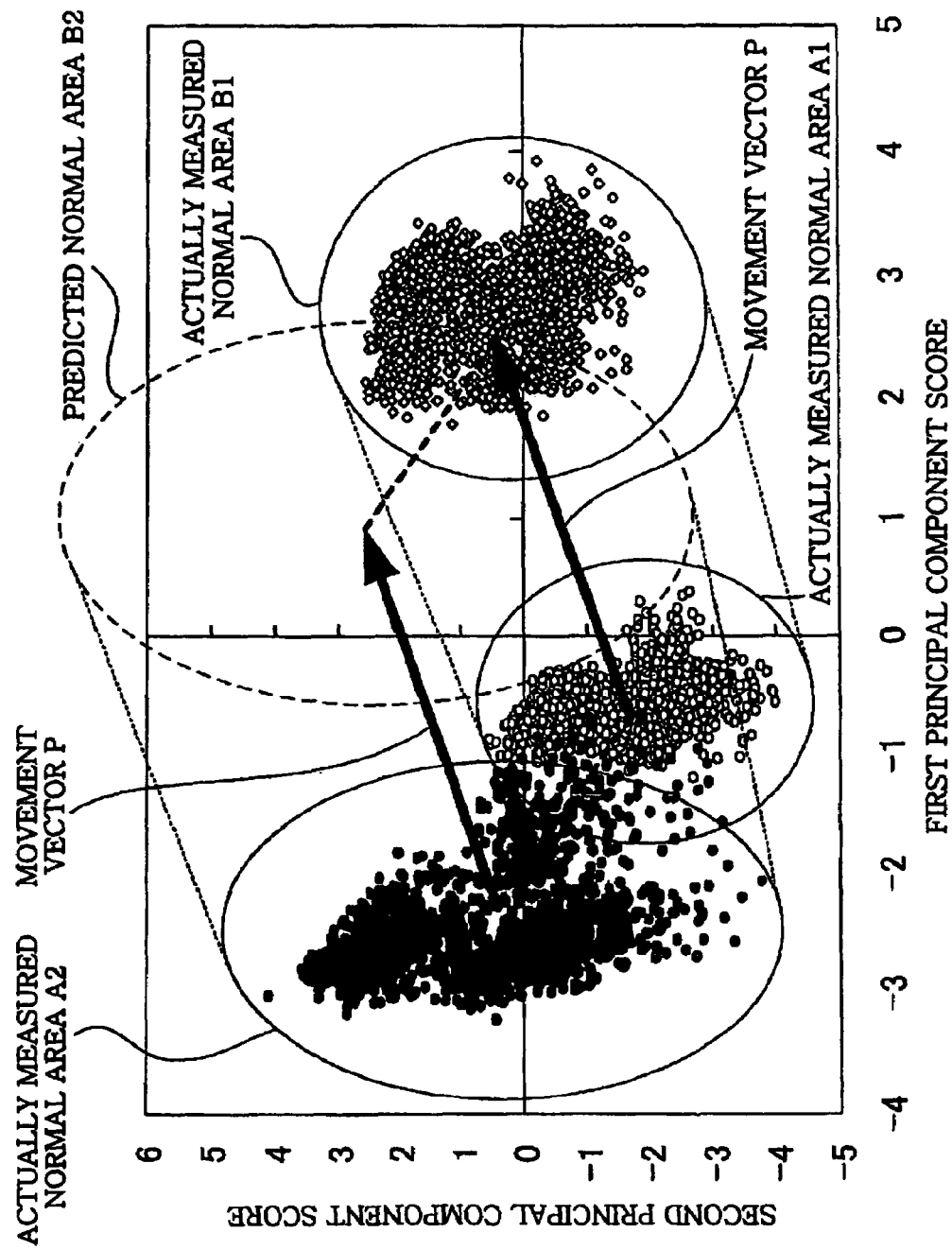
FIG. 6 depicts a graph for explaining a second modification of the process for setting the predicted normal area B2 in the operation status determination method of the first preferred embodiment.

The way of removing the influence of the difference in configuration between the principal component score distributions respectively corresponding to the first recipe operation status data group for reference apparatus and the first recipe operation status data group for target apparatus, is not limited to that described above. For example, as shown in FIG. 6, the movement vector P is calculated in the same manner as that in the step S206, the actually measured normal areas A1 and B1 are set in the two-dimensional coordinate system, and the correlation (e.g., an area ratio, and/or a major axis ratio and a minor axis ratio of the ellipse) between the actually measured normal areas A1 and B1 are calculated. And, when the actually measured normal area A2 is moved along the movement vector P to set the predicted normal area B2, the calculated correlation between the actually measured normal areas A1 and B1 may be applied to the correlation between the actually measured normal area A2 and the predicted normal area B2.

Hereinafter, there will be described an operation status determination method in accordance with a second preferred embodiment of the present invention.

The configurations and functions of the second embodiment are basically the same as those of the first embodiment, but the selected principal components are different from those of the aforementioned first embodiment. Accordingly, the explanations on the same configurations and functions will be omitted, and different configurations and functions will be described below.

In the operation status determination method of the second embodiment, at the step S205 in FIG. 2, two principal components that satisfy desired conditions are selected among the 16 principal components obtained as the result of the principal component analysis at the step S204.

The two principal components satisfying the desired conditions in this embodiment are those that, when each of the single-wafer processing parameter sets in the first recipe operation status data group for reference apparatus, the second recipe operation status data group for reference apparatus and the first recipe operation status data group for target apparatus is converted into the principal component scores of the two principal components and the converted principal component scores are plotted in a two-dimensional coordinate system with axes of the two principal components, the centers of the principal component score distributions respectively corresponding to the first recipe operation status data group for reference apparatus, the second recipe operation status data group for reference apparatus and the first recipe operation status data group for target apparatus are linearly disposed. In this embodiment, the third and the fifth principal component correspond to the two principal components.

Figure 7:
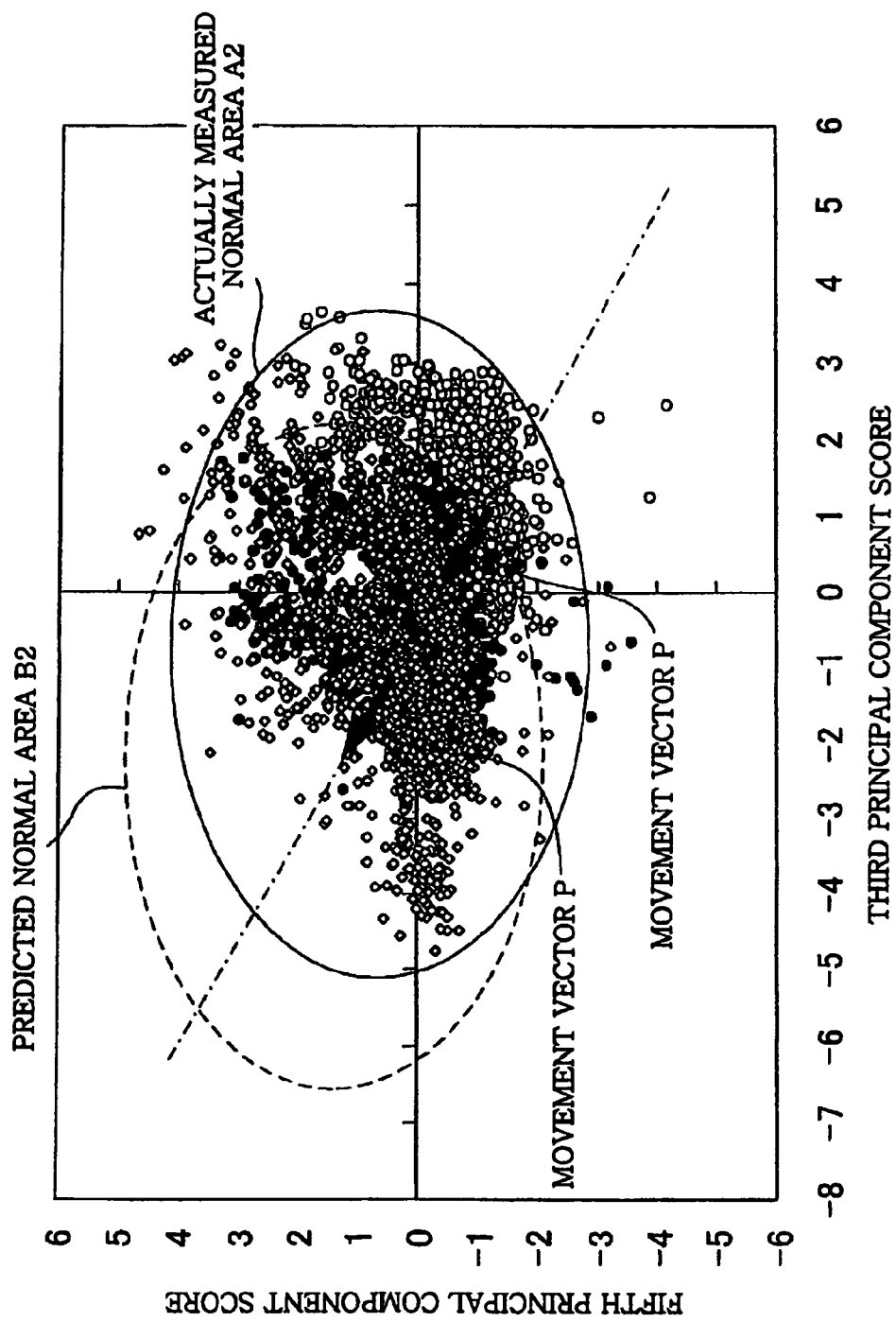
FIG. 7 describes a graph for explaining a process of setting a predicted normal area B2 in an operation status determination method in accordance with a second preferred embodiment of the present invention.

Accordingly, in the operation status determination method of this embodiment, by using eigenvectors corresponding to the third and the fifth principal component, each of the single-wafer processing parameter sets in each operation status data group is converted into the third and the fifth principal component scores. Then, as shown in FIG. 7, the third and the fifth principal component scores converted are plotted in the two-dimensional coordinate system wherein the X and Y axes represent the third and the fifth principal component, respectively. Also in FIG. 7, the principal component scores corresponding to the first recipe operation status data group for reference apparatus are indicated by "○", the principal component scores corresponding to the second recipe operation status data group for reference apparatus are indicated by "●", and the principal component scores corresponding to the first recipe operation status data group for target apparatus are indicated by "◇". Moreover, the centers of the principal component score distributions corresponding to the respective operation status data groups are disposed on the dashed dotted line in FIG. 7.

In accordance with the operation status determination method of this embodiment, in case two principal component are selected from the 16 principal components obtained as the result of the principal component analysis, there are selected the principal components that the centers of the principal component score distributions corresponding to the respective operation status data group are linearly arranged when each of the single-wafer processing parameter sets in each operation status data group is converted into the principal component scores of the two principal components to be plotted in the two-dimensional coordinate system with the axes of the two principal components. Accordingly, it is possible to readily grasp the positional relations of the principal component score distributions corresponding to the respective operation status data groups, thereby making it possible to easily determine the operation status of the target apparatus when the second recipe is applied to thereto.

Further, it goes without saying that the operation status determination method of this embodiment can exhibit effects other than those caused by selecting the first and the second principal component among the effects in the first embodiment as described above. In addition, it is also possible to apply to the operation status determination method of this embodiment the way of removing the influence of the difference in configuration between the principal component score distributions respectively corresponding to the first recipe operation status data group for reference apparatus and the first recipe operation status data group for target apparatus as shown in FIGS. 5 and 6.

Figure 8:
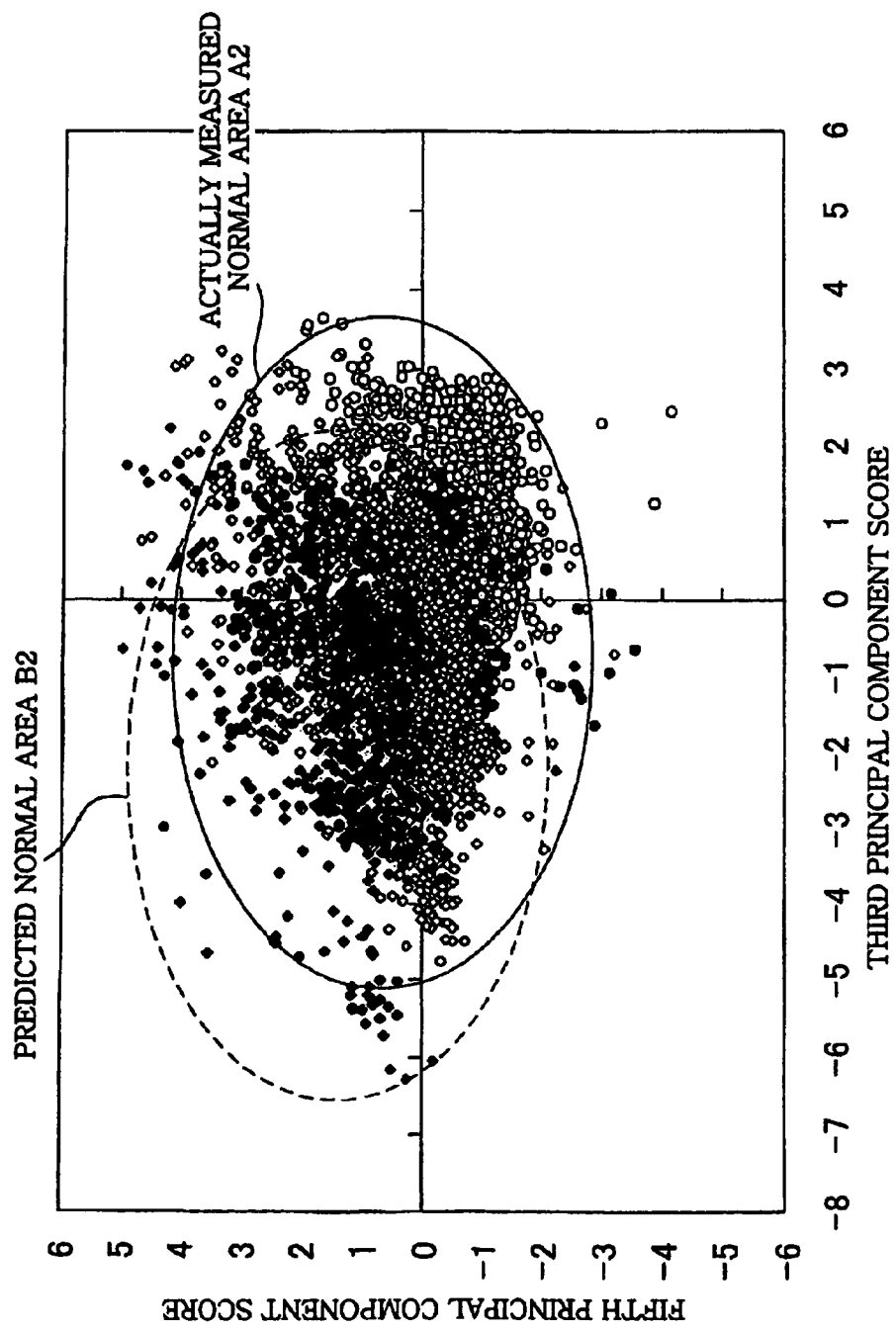
FIG. 8 offers a graph showing a relationship between the predicted normal area B2 set in the operation status determination method of the second preferred embodiment and a principal component score distribution corresponding to a second recipe operation status data group for target apparatus.

Further, in order to confirm the accuracy of the operation status determination method of this embodiment, the inventors converted a large number of single-wafer processing parameter sets in the second recipe operation status data group for target apparatus into the third and the fifth principal component scores and plotted the third and the fifth principal component scores in the two-dimensional coordinate system by using "♦" as shown in FIG. 8. As a result, it was confirmed that the second recipe operation status data group for target apparatus was substantially included in the predicted normal area B2. In this way, also in the operation status determination method of this embodiment, it has been found that it is possible to accurately determine the operation status of the target apparatus by using the predicted normal area B2 when the second recipe is applied thereto.

Hereinafter, there will be described an operation status determination method in accordance with a third preferred embodiment of the present invention.

The configurations and functions of the third embodiment are basically the same as those of the first embodiment, but the number of the operation status data group used in the principal component analysis and the selected principal components are different from those of the aforementioned first embodiment. Accordingly, the explanations on the same configurations and functions will be omitted, and different configurations and functions will be described below.

In the operation status determination method of the third embodiment, at the step S204 in FIG. 2, the principal component analysis is carried out by exclusively using the first recipe operation status data group for reference apparatus and the first recipe operation status data group for target apparatus to calculate an eigenvalue and an eigenvector of each principal component.

Subsequently, at the step S205 in FIG. 2, two principal components that satisfy desired conditions are selected among the 16 principal components obtained as the result of the principal component analysis at the step S204.

The two principal components satisfying the desired conditions in this embodiment are those that, when each of the single-wafer processing parameter sets in the first recipe operation status data group for reference apparatus, the second recipe operation status data group for reference apparatus and the first recipe operation status data group for target apparatus is converted into the principal component scores of the two principal components and the converted principal component scores are plotted in a two-dimensional coordinate system with axes of the two principal components, the principal component score distributions respectively corresponding to the first recipe operation status data group for reference apparatus, the second recipe operation status data group for reference apparatus and the first recipe operation status data group for target apparatus are disposed to be appropriately separated from each other. In this embodiment, the first and the fifth principal component correspond to the two principal components.

Figure 9:
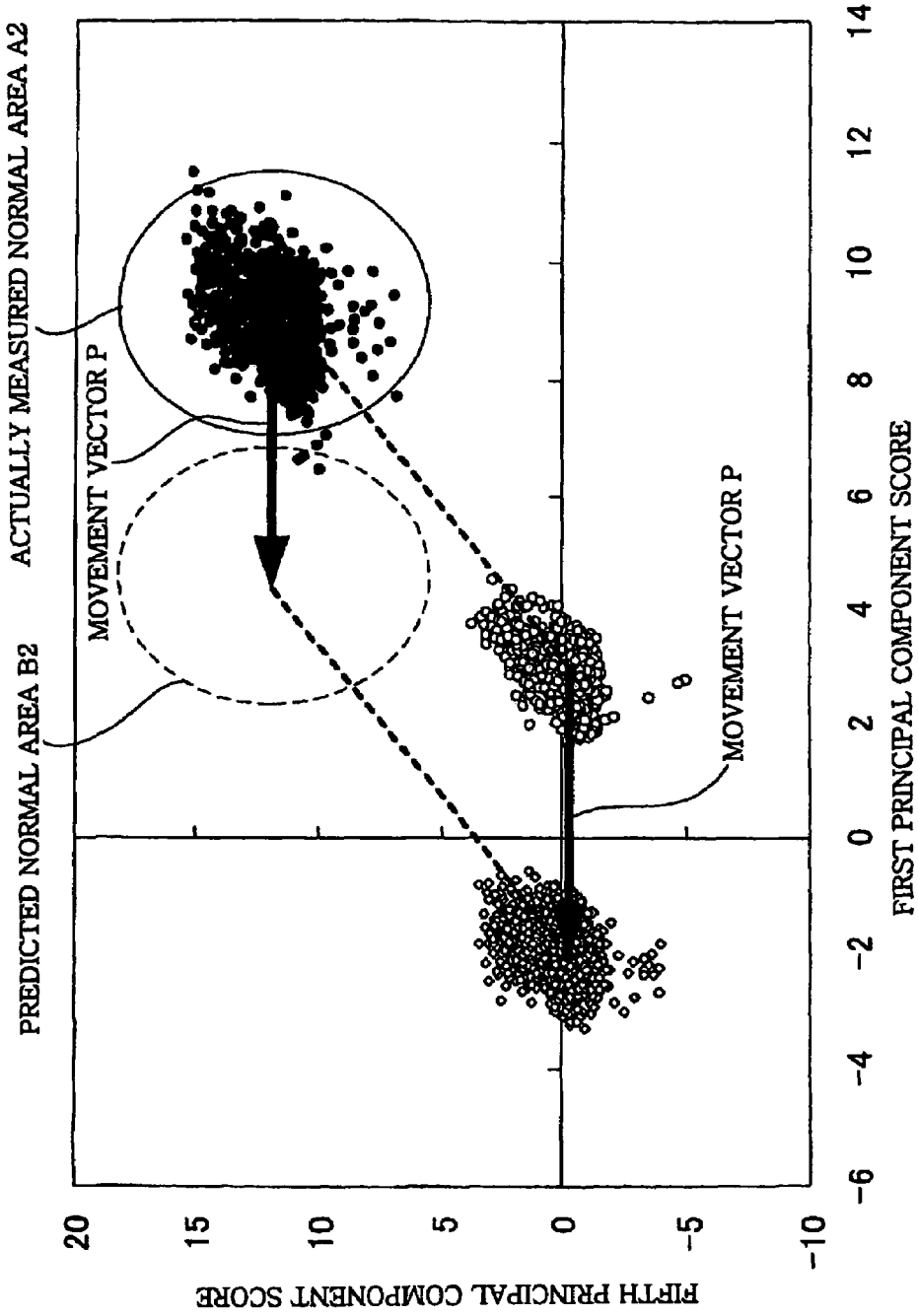
FIG. 9 provides a graph for explaining a process of setting a predicted normal area B2 in an operation status determination method in accordance with a third preferred embodiment of the present invention.

Accordingly, in the operation status determination method of this embodiment, by using eigenvectors corresponding to the first and the fifth principal component, each of the single-wafer processing parameter sets in each operation status data group is converted into the first and the fifth principal component scores. Then, as shown in FIG. 9, the first and the fifth principal component scores converted are plotted in the two-dimensional coordinate system wherein the X and Y axes represent the first and the fifth principal component, respectively. Also in FIG. 9, the principal component scores corresponding to the first recipe operation status data group for reference apparatus are indicated by "○", the principal component scores corresponding to the second recipe operation status data group for reference apparatus are indicated by "●", and the principal component scores corresponding to the first recipe operation status data group for target apparatus are indicated by "◇".

In accordance with the operation status determination method of this embodiment, the principal component analysis is carried out by exclusively using the first recipe operation status data group for reference apparatus and the first recipe operation status data group for target apparatus. The first recipe operation status data group for reference apparatus and the first recipe operation status data group for target apparatus are both the operation status data group when applying the first recipe, and the second recipe operation status data group for reference apparatus is the operation status data group when applying the second recipe. Here, from the fact that the trend of the processing parameter values when applying the first recipe is different from the trend of the processing parameter values when applying the second recipe, if the principal component scores corresponding to the second recipe operation status data group for reference apparatus are plotted in the two-dimensional coordinate system based on the principal components obtained by the principal component analysis carried out by exclusively using the first recipe operation status data group for reference apparatus and the first recipe operation status data group for target apparatus, the distribution of the principal component scores corresponding to the first recipe operation status data group for reference apparatus and the first recipe operation status data group for target apparatus are clearly separated from the distribution of the principal component scores corresponding to the second recipe operation status data group for reference apparatus. Accordingly, it is possible to readily grasp the configuration of each principal component distribution.

Further, it goes without saying that the operation status determination method of this embodiment can exhibit effects other than those caused by carrying out the principal component analysis using all of the first recipe operation status data group for reference apparatus, the second recipe operation status data group for reference apparatus and the first recipe operation status data group for target apparatus and those caused by selecting the first and the second principal component, among the effects in the first embodiment as described above. In addition, it is also possible to apply to the operation status determination method of this embodiment the way of removing the influence of the difference in configuration between the principal component score distributions respectively corresponding to the first recipe operation status data group for reference apparatus and the first recipe operation status data group for target apparatus as shown in FIGS. 5 and 6.

Figure 10:
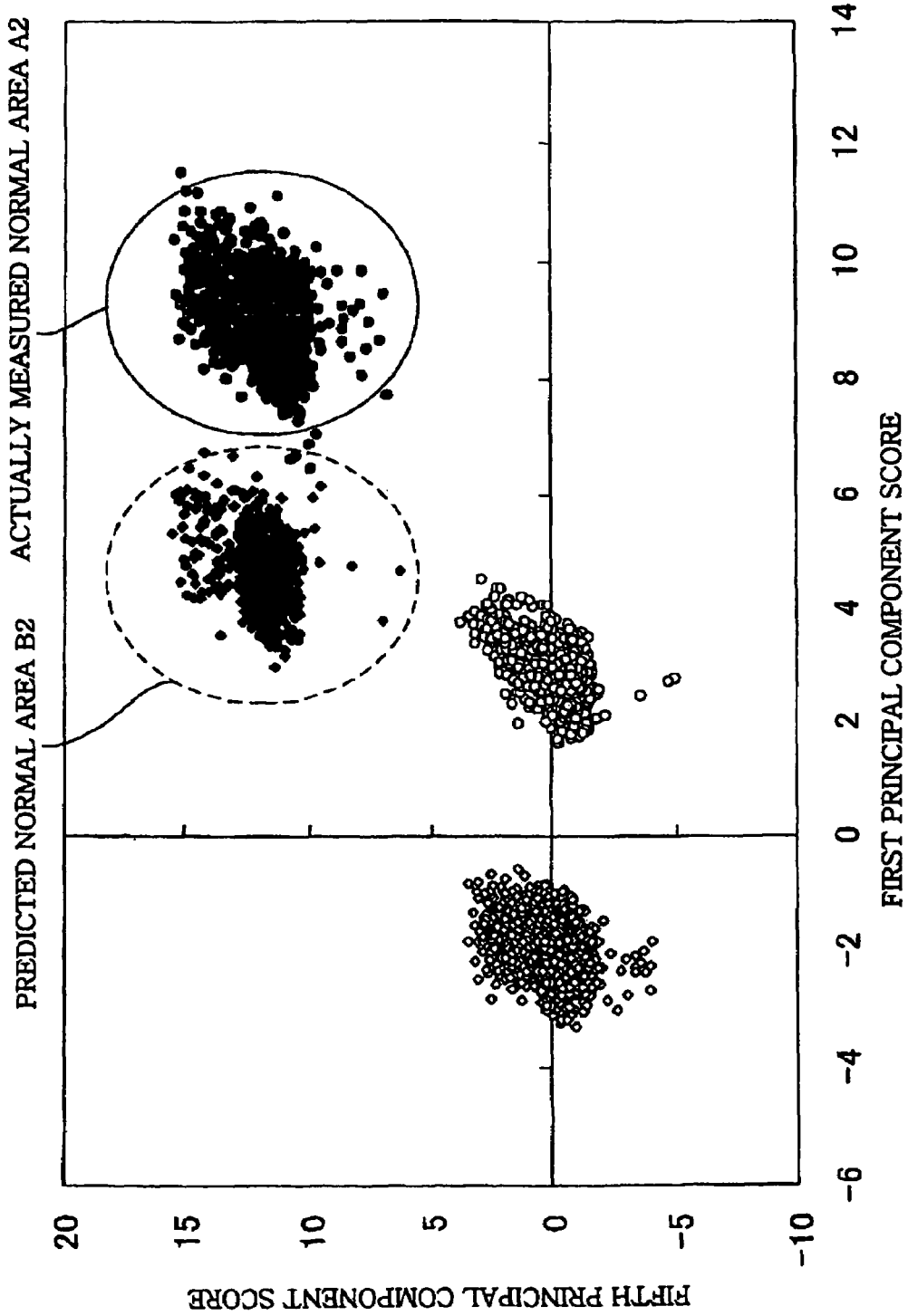
FIG. 10 sets forth a graph showing a relationship between the predicted normal area B2 set in the operation status determination method of the third preferred embodiment and a principal component score distribution corresponding to a second recipe operation status data group for target apparatus.

Further, in order to confirm the accuracy of the operation status determination method of this embodiment, the inventors converted a large number of single-wafer processing parameter sets in the second recipe operation status data group for target apparatus into the first and the fifth principal component scores and plotted the first and the fifth principal component scores in the two-dimensional coordinate system by using "♦" as shown in FIG. 10. As a result, it was confirmed that the second recipe operation status data group for target apparatus was substantially included in the predicted normal area B2. In this way, also in the operation status determination method of this embodiment, it has been found that it is possible to accurately determine the operation status of the target apparatus by using the predicted normal area B2 when the second recipe is applied thereto.

Hereinafter, there will be described an operation status determination method in accordance with a fourth preferred embodiment of the present invention.

The configurations and functions of the fourth embodiment are basically the same as those of the first embodiment, but the number of the operation status data groups used in the principal analysis and the selected principal components are different from those of the aforementioned first embodiment. Accordingly, the explanations on the same configurations and functions will be omitted, and different configurations and functions will be described below.

In the operation status determination method of the fourth embodiment, at the step S204 in FIG. 2, the principal analysis is carried out by exclusively using the first recipe operation status data group for reference apparatus to calculate an eigenvalue and an eigenvector of each principal component.

Subsequently, at the step S205 of FIG. 2, two principal components that satisfy desired conditions are selected among the 16 principal components obtained as the result of the principal component analysis at the step S204.

The two principal components satisfying the desired conditions in this embodiment are those having the same property as that of the principal components selected in the aforementioned third embodiment. In this embodiment, the second and the fifth principal component correspond to the two principal components.

Figure 11:
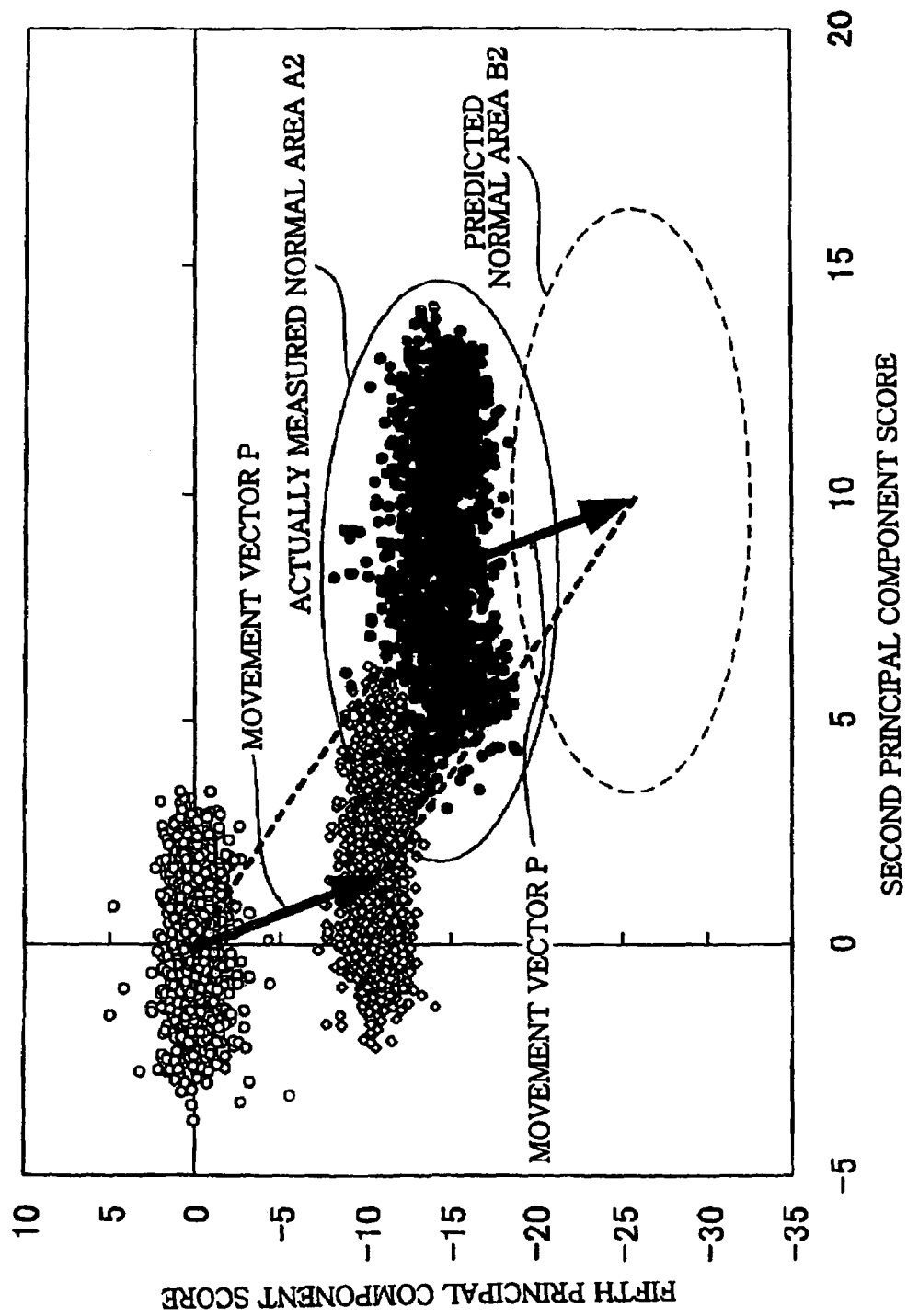
FIG. 11 describes a graph for explaining a process of setting a predicted normal area B2 in an operation status determination method in accordance with a fourth preferred embodiment of the present invention.

Accordingly, in the operation status determination method of this embodiment, by using eigenvectors corresponding to the second and the fifth principal component, each of the single-wafer processing parameter sets in each operation status data group is converted into the second and the fifth principal component scores. Then, as shown in FIG. 11, the second and the fifth principal component scores converted are plotted in the two-dimensional coordinate system wherein the X and Y axes represent the second and the fifth principal component, respectively. Also in FIG. 11, the principal component scores corresponding to the first recipe operation status data group for reference apparatus are indicated by "○", the principal component scores corresponding to the second recipe operation status data group for reference apparatus are indicated by "●", and the principal component scores corresponding to the first recipe operation status data group for target apparatus are indicated by "◇".

In accordance with the operation status determination method of this embodiment, since the principal component analysis is carried out by exclusively using the first recipe operation status data group for reference apparatus, the difference between the reference apparatus and the target apparatus and the difference in processing condition between the first recipe and the second recipe are not considered. Accordingly, if the principal component scores corresponding to the first recipe operation status data group for target apparatus and the second recipe operation status data group for reference apparatus are plotted in the two-dimensional coordinate system based on the principal components obtained by the principal component analysis carried out by using only the first recipe operation status data group for reference apparatus, the principal component score distributions corresponding to the respective operation status data groups are clearly separated from each other. In this way, it is possible to readily grasp the configuration of each principal component score distribution.

Further, it goes without saying that, similarly to the operation status determination method of the third embodiment, the operation status determination method of this embodiment can also exhibit effects other than those caused by carrying out the principal component analysis using all of the first recipe operation status data group for reference apparatus, the second recipe operation status data group for reference apparatus and the first recipe operation status data group for target apparatus and those caused by selecting the first and the second principal component, among the effects in the first embodiment as described above. In addition, it is also possible to apply to the operation status determination method of this embodiment the way of removing the influence of the difference in configuration between the principal component score distributions respectively corresponding to the first recipe operation status data group for reference apparatus and the first recipe operation status data group for target apparatus as shown in FIGS. 5 and 6.

Figure 12:
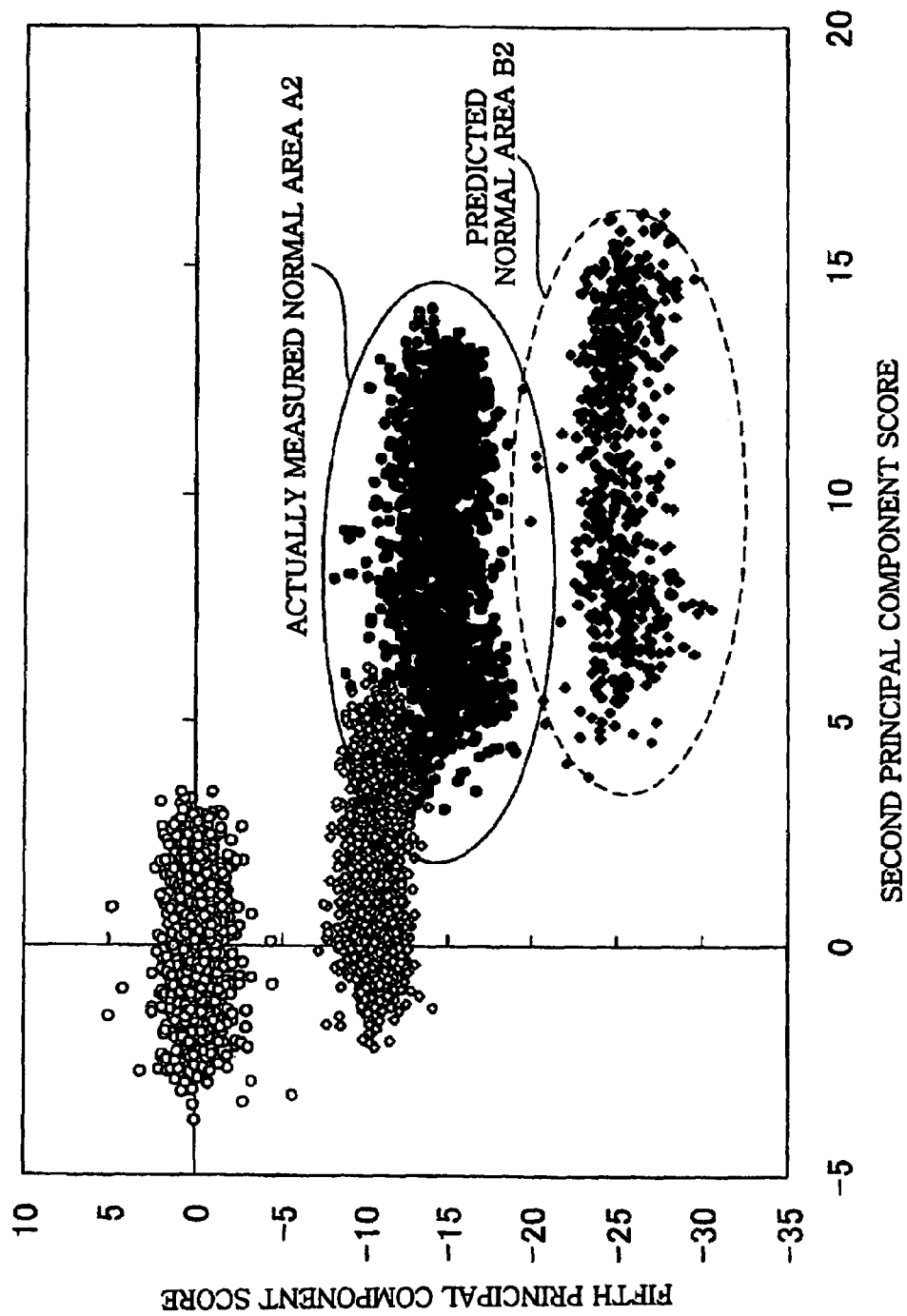
FIG. 12 depicts a graph showing a relationship between the predicted normal area B2 set in the operation status determination method of the third preferred embodiment and a principal component score distribution corresponding to a second recipe operation status data group for target apparatus.

Further, in order to confirm the accuracy of the operation status determination method of this embodiment, the inventors converted a large number of single-wafer processing parameter sets in the second recipe operation status data group for target apparatus into the second and the fifth principal component scores and plotted the second and the fifth principal component scores in the two-dimensional coordinate system by using "♦" as shown in FIG. 12. As a result, it was confirmed that the second recipe operation status data group for target apparatus was substantially included in the predicted normal area B2. In this way, also in the operation status determination method of this embodiment, it has been found that it is possible to accurately determine the operation status of the target apparatus when the second recipe is applied thereto by using the predicted normal area B2.

In the operation status determination methods of the aforementioned embodiments, two principal components are selected among the plural principal components obtained as the result of the principal component analysis and the principal component scores are plotted in the two-dimensional coordinate system with the axes of the two principal components. However, the number of the selected principal components is not limited to 2 (two), but may be 3 or more. For example, three principal components may be selected among the plural principal components obtained, and the principal component scores may be plotted in a three-dimensional coordinate system with axes of the three principal components. In this case, the points plotted in the three-dimensional coordinate system reflect the three principal component scores, so that it is possible to make the loss of information on the single-wafer parameter set less, thereby carrying out a statistically reliable operation status-determination.

Further, although the system controller 32 as the operation status determination apparatus in the aforementioned embodiments is provided separately from the etching processing apparatus 1, it may be provided as one unit with the etching processing apparatus to reduce the installation space thereof. Moreover, the system controller 32 may be constructed with a portable PC and the like, not an integrated server. This can improve the operator's convenience.

Furthermore, as the substrate subjected to the etching process in the etching processing apparatus to which the operation status determination method in accordance with each of the aforementioned embodiments is applied, there may be employed various substrates for a liquid crystal display (LCD) and a flat panel display (FPD), a photomask, a CD substrate, a printed substrate and the like as well as the semiconductor wafer.

In addition, while the operation status determination method in accordance with each of the aforementioned embodiments is applied to the etching processing apparatus, the operation status determination method of the present invention may be applied to other plasma processing apparatuses, e.g., a CVD processing apparatus, than the etching processing apparatus.

Moreover, the object of the present invention is also achieved in such a way that a storage medium storing program codes of software for realizing the functions of the aforementioned embodiments is supplied to the computer, e.g., the system controller 32, and the CPU of the computer reads out and executes the program codes stored in the storage medium.

In this case, the program codes themselves read out from the storage medium realize the functions of the aforementioned embodiments, and the program codes and the storage medium storing the same make up the present invention.

As for the storage medium for supplying the program codes, there may be used stuffs capable of storing the program codes, which include, e.g., RAM, a NV-RAM, a floppy (registered trademark) disc, a hard disc, a magneto-optical disc, an optical disc such as a CD-ROM, a CD-R, a CD-RW and a DVD (DVD-ROM, DVD-RAM, DVD-RW, DVD+RW), a magnetic tape, a nonvolatile memory card, a ROM, and the like. Alternatively, the program may be downloaded from a computer or a database (not shown) connected to the Internet, a commercial network, a local area network or the like.

In addition, besides the mechanism of directly realizing the functions of the above-described embodiments by executing the program codes read out by the computer, it is also possible to set an operating system (OS) working on the CPU to perform an actual processing partially or entirely based on instructions of the program codes and realize the functions of the embodiments through such processing.

In addition, the functions of the aforementioned embodiments can be implemented by recording the program codes read out from the storage medium on a memory provided in a function extension board inserted in the computer or a function extension unit connected to the computer and then performing a partial or entire actual processing with the help of the CPU or the like provided in the function extension board or in the function extension unit based on the instruction of the program codes.

The program codes may also be object codes, program codes implemented by an interpreter, script data supplied to the OS, or the like.

While the invention has been shown and described with respect to the preferred embodiments with reference to the accompanying drawings, it will be understood by those skilled in the art that various changes and modifications may be made without departing from the spirit and scope of the invention as defined in the claims.

What is claimed is:

1. An operation status determination method for determining an operation status of a second plasma processing apparatus when a processing condition employed in a first plasma processing apparatus is applied to the second plasma processing apparatus, the method comprising the steps of:
  (a) obtaining a first operation status data group including processing parameter values measured during a plasma process performed in accordance with a first processing condition applied to the first plasma processing apparatus;
  (b) obtaining a second operation status data group including processing parameter values measured during a plasma process performed in accordance with a second processing condition applied to the first plasma processing apparatus;
  (c) obtaining a third operation status data group including processing parameter values measured during a plasma process performed in accordance with the first processing condition applied to the second plasma processing apparatus;
  (d) carrying out a principal component analysis by using at least one of the first, the second and the third operation status data group obtained;
  (e) plotting principal component scores corresponding to two principal components selected among a plurality of principal components obtained by the principal component analysis using at least one of the first, the second and the third operation status data group in a two-dimensional coordinate system with axes of the two principal components;
  (f) calculating the centers of principal component score distributions respectively corresponding to the first, the second and the third operation status data group in the two-dimensional coordinate system;
  (g) calculating a movement vector from the center of the principal component score distribution corresponding to the first operation status data group to the center of the principal component score distribution corresponding to the third operation status data group;
  (h) setting an area of the principal component score distribution corresponding to the second operation status data group in the two-dimensional coordinate system;
  (i) by moving the area of the principal component score distribution corresponding to the second operation status data group along the movement vector, setting an area of a predicted distribution of principal component scores corresponding to two principal components of processing parameter values measured during a plasma process performed when the second processing condition is applied to the second plasma processing apparatus; and (j) by actually applying the second processing condition to the second plasma processing apparatus, determining whether or not the principal component scores corresponding to the two principal components of the processing parameter values measured during the plasma process performed in accordance with the second processing condition are included in the area of the predicted distribution.

2. The operation status determination method of claim 1, wherein the center of the principal component score distribution is an average value or a central value of each of the principal component score distributions respectively corresponding to the first, the second and the third operation status data group.

3. The operation status determination method of claim 1, wherein the two principal components are the first and the second principal component.

4. The operation status determination method of claim 1, wherein the two principal components are selected among the plurality of principal components such that the centers of the principal component score distributions respectively corresponding to the first, the second and the third operation status data group are linearly arranged in the two-dimensional coordinate system.

5. The operation status determination method of claim 1, wherein the area of the principal component score distribution corresponding to the second operation status data group is set based on a variance of the principal component scores corresponding to the second operation status data group.

6. The operation status determination method of claim 5, wherein the area of the principal component score distribution corresponding to the second operation status data group is an elliptical area with axes of the two principal components.

7. The operation status determination method of claim 1, wherein the processing parameter values measured during the plasma process performed in accordance with the first processing condition applied to the first plasma processing apparatus, the processing parameter values measured during the plasma process performed in accordance with the second processing condition applied to the first plasma processing apparatus and the processing parameter values measured during the plasma process performed in accordance with the first processing condition applied to the second plasma processing apparatus, are all those measured during the respective plasma processes which are normally performed.

8. The operation status determination method of claim 1, wherein at the step (d), the principal component analysis is carried out by using all of the first, the second and the third operation status data group obtained.

9. A storage medium storing a program for executing on a computer an operation status determination method for determining an operation status of a second plasma processing apparatus when a processing condition employed in a first plasma processing apparatus is applied to the second plasma processing apparatus, wherein the program comprises:

a module for obtaining a first operation status data group including processing parameter values measured during a plasma process performed in accordance with a first processing condition applied to the first plasma processing apparatus;

a module for obtaining a second operation status data group including processing parameter values measured during a plasma process performed in accordance with a second processing condition applied to the first plasma processing apparatus;

a module for obtaining a third operation status data group including processing parameter values measured during a plasma process performed in accordance with the first processing condition applied to the second plasma processing apparatus;

a module for executing a principal component analysis by using at least one of the first, the second and the third operation status data group obtained;

a module for plotting principal component scores corresponding to two principal components selected among a plurality of principal components obtained by the principal component analysis using the first, the second and the third operation status data group in a two-dimensional coordinate system with axes of the two principal components;

a module for calculating the center of principal component score distributions respectively corresponding to the first, the second and the third operation status data group in the two-dimensional coordinate system;

a module for calculating a movement vector from the center of the principal component score distribution corresponding to the first operation status data group to the center of the principal component score distribution corresponding to the third operation status data group;

a module for setting an area of the principal component score distribution corresponding to the second operation status data group in the two-dimensional coordinate system;

a module for, by moving the area of the principal component score distribution corresponding to the second operation status data group along the movement vector, setting an area of a predicted distribution of principal component scores corresponding to two principal components of processing parameter values measured during a plasma process performed when the second processing condition is applied to the second plasma processing apparatus; and a module for, by actually applying the second processing condition to the second plasma processing apparatus, determining whether or not the principal component scores corresponding to the two principal components of the processing parameter values measured during the plasma process performed in accordance with the second processing condition are included in the area of the predicted distribution.

10. An operation status determination system for determination of an operation status of a second plasma processing apparatus when a processing condition employed in a first plasma processing apparatus is applied to the second plasma processing apparatus, said system comprising:

a controller in communication with the first and second plasma processing apparatuses and having memory elements for storage of, a first operation status data group including processing parameter values measured during a plasma process performed in accordance with a first processing condition applied to the first plasma processing apparatus, a second operation status data group including processing parameter values measured during a plasma process performed in accordance with a second processing condition applied to the first plasma processing apparatus, and a third operation status data group including processing parameter values measured during a plasma process performed in accordance with the first processing condition applied to the second plasma processing apparatus;

said controller including a processor programmed to
- a) perform a principal component analysis by using at least one of the first, the second and the third operation status data group obtained,
- b) plot principal component scores corresponding to two principal components selected among a plurality of principal components obtained by the principal component analysis using at least one of the first, the second and the third operation status data group in a two-dimensional coordinate system with axes of the two principal components,
- c) calculate the center of principal component score distributions respectively corresponding to the first, the second and the third operation status data group in the two-dimensional coordinate system,
- d) calculate a movement vector from the center of the principal component score distribution corresponding to the first operation status data group to the center of the principal component score distribution corresponding to the third operation status data group, and
- e) set an area of the principal component score distribution corresponding to the second operation status data group in the two-dimensional coordinate system, wherein said processor, by moving the area of the principal component score distribution corresponding to the second operation status data group along the movement vector, is programmed to
- d-1) set an area of a predicted distribution of principal component scores corresponding to the two principal components of the processing parameter values measured during the plasma process performed when the second processing condition is applied to the second plasma processing apparatus, and
- d-2) apply the second processing condition to the second plasma processing apparatus to determine whether or not the principal component scores corresponding to the two principal components of the processing parameter values measured during the plasma process performed in accordance with the second processing condition are included in the area of the predicted distribution.

* * * * *